United States Patent
Oberlitner et al.

(10) Patent No.: US 6,547,937 B1
(45) Date of Patent: Apr. 15, 2003

(54) MICROELECTRONIC WORKPIECE PROCESSING TOOL INCLUDING A PROCESSING REACTOR HAVING A PADDLE ASSEMBLY FOR AGITATION OF A PROCESSING FLUID PROXIMATE TO THE WORKPIECE

(75) Inventors: Thomas H. Oberlitner, Kalispell, MT (US); Kyle M. Hanson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/476,526

(22) Filed: Jan. 3, 2000

(51) Int. Cl.[7] .............................. C25D 17/00; C25C 3/00
(52) U.S. Cl. ................... 204/224 R; 204/222; 204/245
(58) Field of Search ................. 204/224 R, 198, 204/222, 228.2, 245, 247.1

(56) References Cited

U.S. PATENT DOCUMENTS

| | | | |
|---|---|---|---|
| 5,312,532 A | 5/1994 | Andricacos et al. | 204/231 |
| 5,344,491 A | 9/1994 | Katou | 118/695 |
| 5,421,987 A | 6/1995 | Tzanavaras et al. | 205/133 |
| 5,431,421 A * | 7/1995 | Thompson et al. | 118/503 |
| 5,516,412 A * | 5/1996 | Andricacos et al. | 204/224 M |
| 5,925,226 A | 7/1999 | Hurwitt et al. | 204/298.15 |
| 6,001,235 A | 12/1999 | Arken et al. | 205/137 |
| 6,228,231 B1 * | 5/2001 | Uzoh | 204/224 R |
| 6,251,250 B1 * | 6/2001 | Keigler | 204/224 R |

FOREIGN PATENT DOCUMENTS

| | | |
|---|---|---|
| EP | 0 343 502 A2 | 11/1989 |
| EP | 0 726 698 A2 | 8/1996 |
| JP | 62-297494 * | 12/1987 |
| JP | 62297495 | 12/1987 |
| JP | 1-120827 * | 5/1989 |
| JP | 05175158 | 7/1993 |
| JP | 06260468 | 9/1994 |
| JP | 07211724 | 8/1995 |
| JP | 07284738 | 10/1995 |
| JP | 10172974 | 6/1998 |
| JP | 11092993 | 4/1999 |
| JP | 2000017480 | 1/2000 |
| WO | WO 99/25004 | 5/1999 |

OTHER PUBLICATIONS

International Search Report for International Application No. PCT/US01/00173; mailed Oct. 12, 2001; Applicant: Semitool, Inc.; 7 pages.

* cited by examiner

Primary Examiner—Nam Nguyen
Assistant Examiner—Erica Smith-Hicks
(74) Attorney, Agent, or Firm—Perkins Coie LLP

(57) ABSTRACT

An integrated tool is provided including at least one workpiece processing station having a paddle assembly. In accordance with one aspect of the invention, the workpiece processing station is adapted for adjusting the level of the processing fluid relative to a workpiece, wherein the portion of the workpiece to be processed and possibly the paddle is selectively immersed within the processing fluid. In accordance with a further aspect of the invention, a paddle is provided for use proximate to a workpiece in a workpiece processing station. The paddle includes a one or more sets of delivery ports and one or more sets of fluid recovery ports. In at least one embodiment, the paddle provides for agitation of a processing fluid proximate to the surface of the workpiece. In at least another embodiment, the paddle provides for the delivery and/or recovery of one or more fluids to the portion of the workpiece to be processed. One aspect of the present invention enables the fluids supplied to the workpiece by the paddle to be limited to the space located between the workpiece and the paddle, thus avoiding mixing of these fluids with the processing fluid located within the bowl assembly not supplied by the paddle.

34 Claims, 14 Drawing Sheets

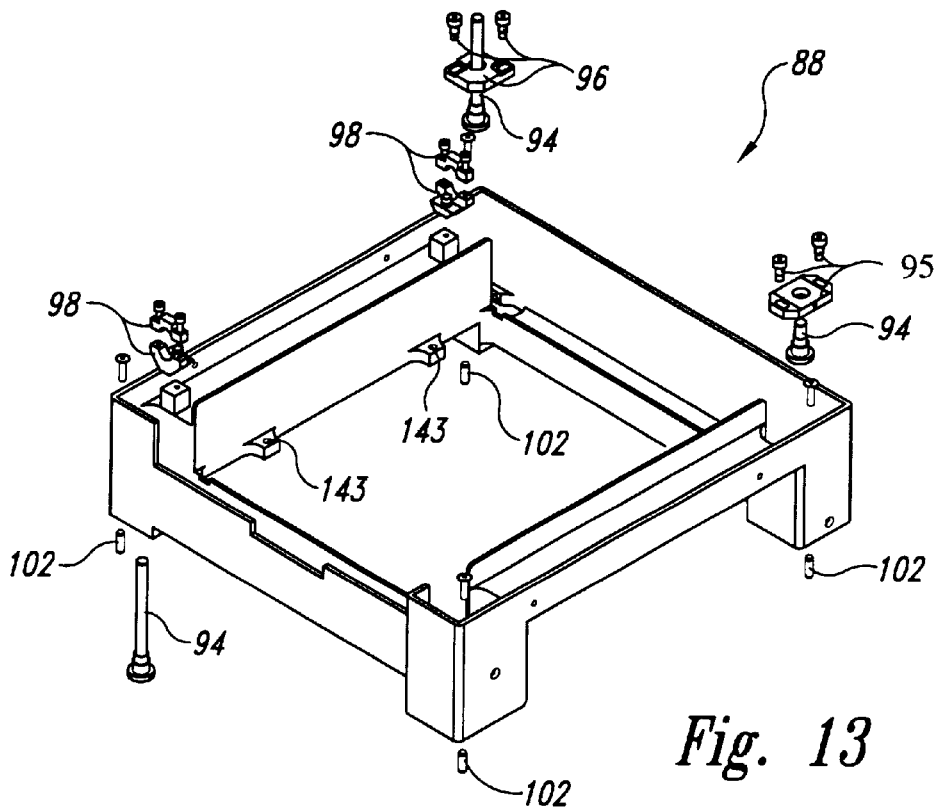
Fig. 13
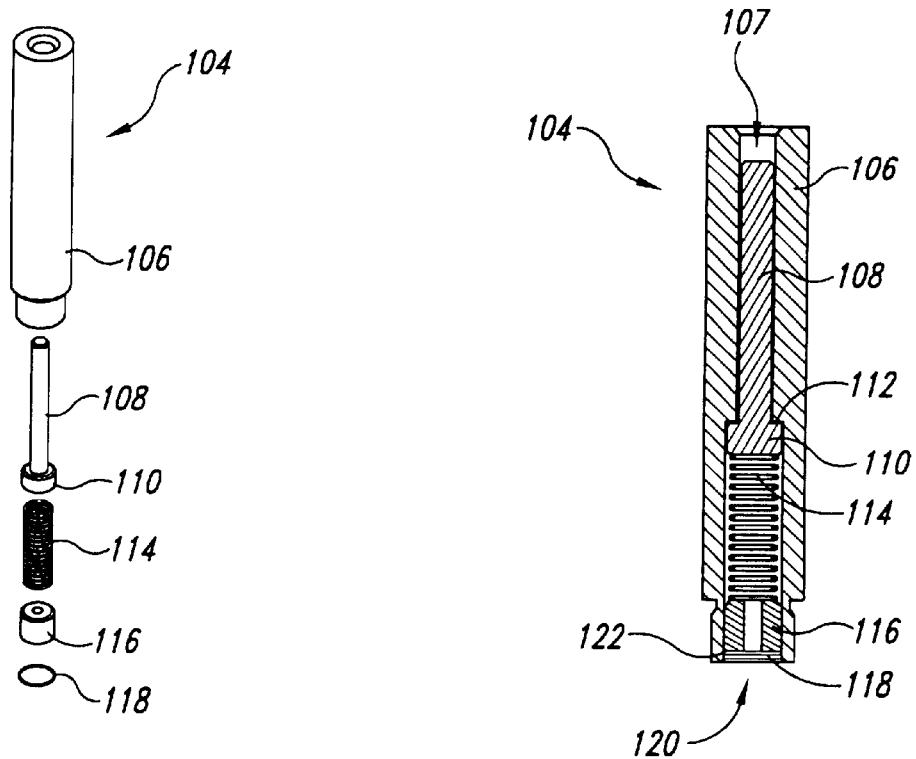
Fig. 14
Fig. 15

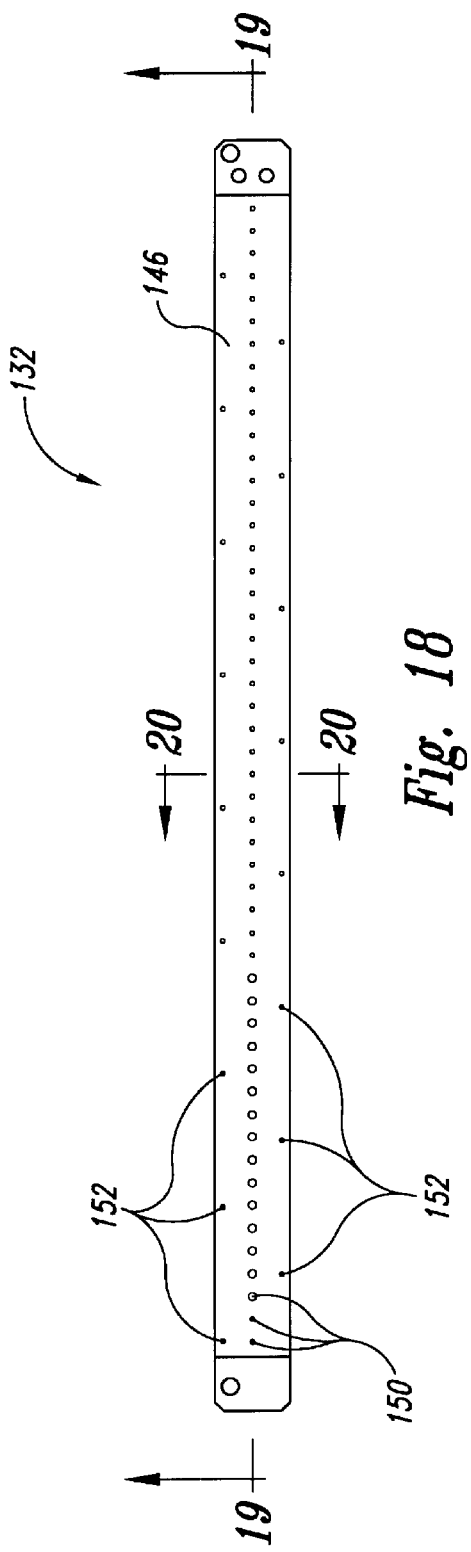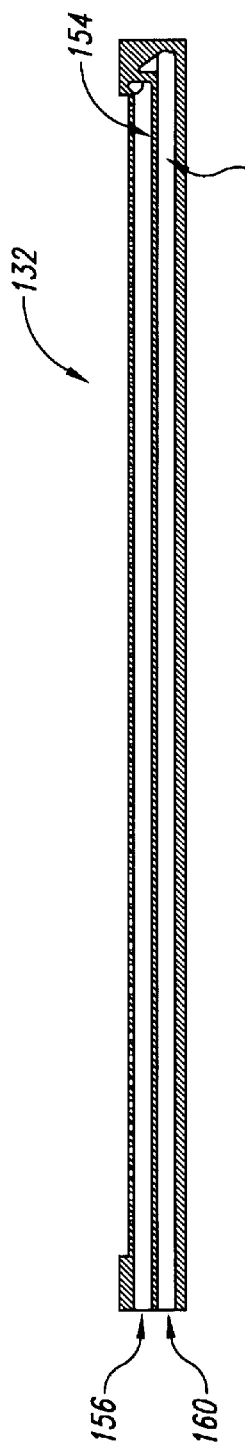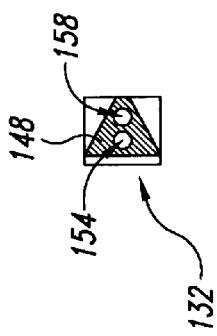
Fig. 18
Fig. 19
Fig. 20

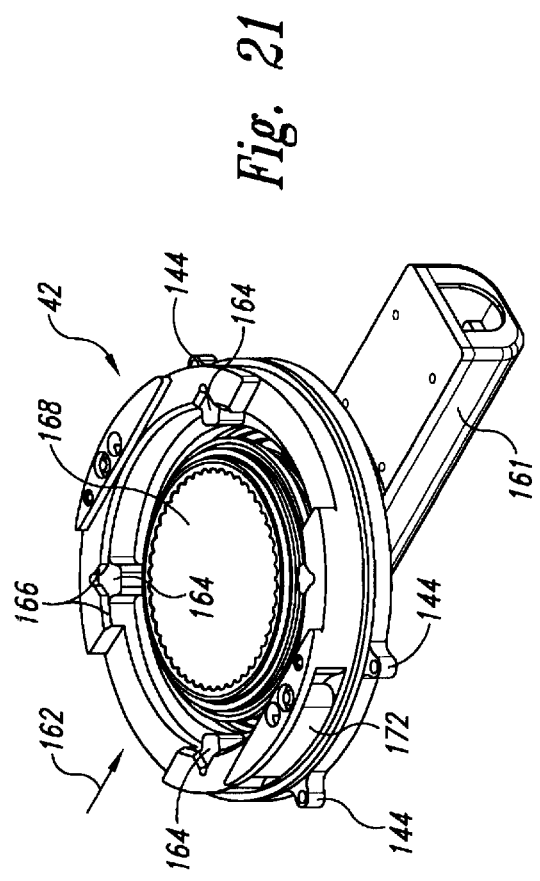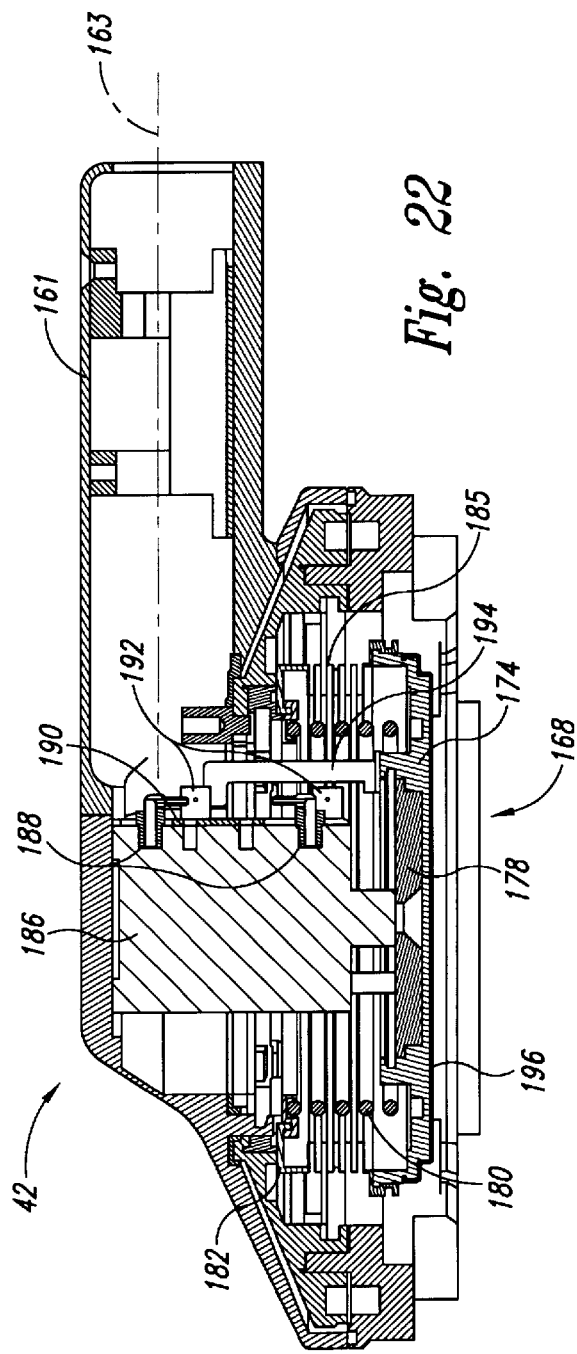

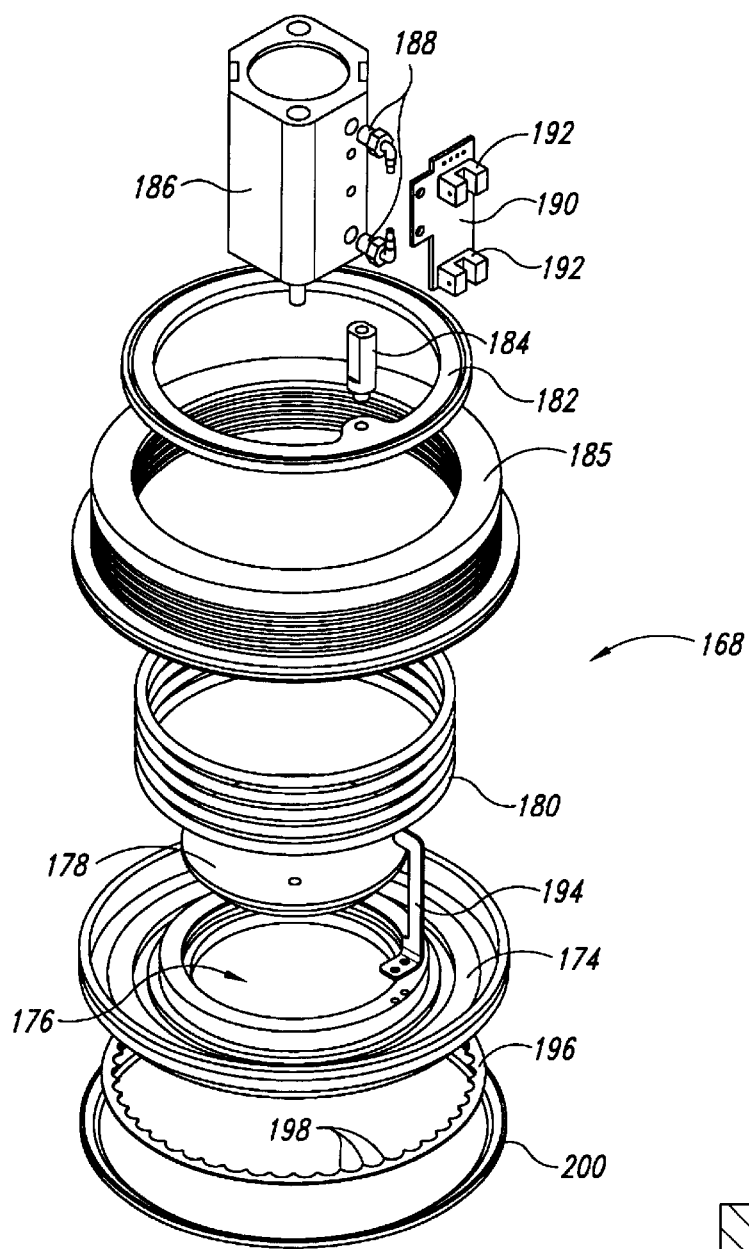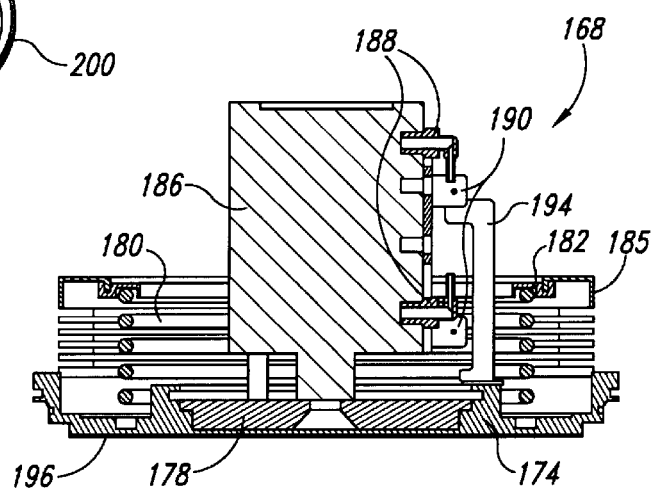
Fig. 23
Fig. 24

MICROELECTRONIC WORKPIECE PROCESSING TOOL INCLUDING A PROCESSING REACTOR HAVING A PADDLE ASSEMBLY FOR AGITATION OF A PROCESSING FLUID PROXIMATE TO THE WORKPIECE

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention generally relates to an apparatus for processing a microelectronic workpiece. More particularly, the present invention is directed to a microelectronic workpiece processing tool having a reactor that includes a paddle assembly, which moves relative to the workpiece for facilitating the processing of a microelectronic workpiece. For purposes of the present application, a microelectronic workpiece is defined to include a substrate upon which microelectronic circuits or components, data storage elements or layers, and/or micro-mechanical elements are formed.

During the processing of a workpiece, the portion of the workpiece to be processed is often exposed to a processing fluid designed to bring about a desired alteration of the surface of the workpiece. In many instances, the alteration of the surface of the workpiece involves a particular chemical reaction that takes place at the surface. As the reaction takes place at the surface, the reactants from the processing fluid are consumed and/or chemical byproducts are released into the fluid. In order to maintain the desired forward reaction at the workpiece surface at optimal levels, it is often necessary to continuously replenish the processing fluid proximate the workpiece surface that is processed.

One known technique for replenishing the processing fluid proximate the workpiece surface includes spinning the workpiece to agitate the processing fluid near the surface of the workpiece. In this way, relatively fresh processing fluid whose chemical concentrations have not yet been significantly affected by the localized reactions taking place at the surface of the workpiece will continuously replace the spent processing fluid.

There are instances, however, in which spinning a workpiece relative to the processing fluid is undesirable. For example, rotation of the workpiece may be undesirable when electroplating certain materials onto a workpiece where the deposited material must be uniformly aligned in a particular magnetically polarized direction. Such processes are used in the formation of certain read/write heads. In such processes, an external magnetic field is applied to the processing area, which magnetically aligns the material to be plated prior to the material being deposited. If the workpiece within the magnetic field were to be spun, the orientation of the magnetic field with respect to the workpiece would be continuously changing. A continuously changing orientation of the magnetic field would disrupt the formation of the desired magnetically uniform deposition.

In view of the foregoing, other methods for agitating the processing fluid have been developed for insuring the continuous replenishment of the processing fluid proximate the workpiece surface under process. Namely, a paddle is used that physically moves through the processing fluid relative to and proximate to the workpiece surface to thereby agitate the processing fluid near the surface. Such agitation has the effect of replenishing the processing fluid proximate the workpiece surface.

In addition to agitating the processing fluid, the paddle motion has been separately developed to limit processing to a portion of the area of the workpiece surface that is to be processed. In essence, this provides localized control of the processing of the workpiece, including localized control of the application of processing fluids. To this end, the paddle is directed to move across the workpiece in a predefined manner, selectively applying chemistry and/or processing power at any one time to only a portion of the total area to be processed. Techniques which provide both linear and spiral movement of the paddle relative to the workpiece have been previously developed.

In these instances, concurrent processing of the entire portion of the workpiece to be processed can produce undesirable or incomplete results. In at least one instance a paddle has been used to produce a controlled linear flow of the processing across the area to be processed. The paddle is used to selectively supply processing fluid to only a portion of the surface at any one time. The direction of the processing is similarly controlled. The direction of the processing is controlled in processes where the specific order in which the separate portions of the surface are processed is important.

One example of where the application of processing fluid for processing a workpiece in a controlled fashion has been used is in the electroetching or removal of a material from the surface of the workpiece. In such instances, the material being removed provides the conductive path for supplying a necessary portion of the processing power. As a result, the removal of material must be performed in a generally controlled manner, since global removal of the entire conductive surface of the workpiece to be processed would result in the etching away of portions of the conductive layer located proximate to the source of processing power prior to those areas located remote from the processing power source. This would result in electrical isolation of such remote areas from the processing power prior to the completion of the electroetch in those areas. By selectively applying the etching process and beginning with the areas furthest from the processing power source, the likelihood of electrically isolating a region prior to completing the electroetching in that region is reduced.

In addition to supplying processing fluid to the surface of the workpiece, previous paddles have been similarly equipped with a conductive surface coupled to a power source. Accordingly, processing power can be supplied to the paddle for the purpose of acting as an electrode in an electrochemical process.

However, in known systems, the processing fluid supplied by the paddle has been allowed to run off of the workpiece and the paddle into the processing chamber. Effectively the processing fluid associated with the electroetch process is then unavoidably present throughout the processing chamber. The presence of processing fluid throughout the processing chamber may preclude the use of the same processing chamber for use in a subsequent processing step, especially where a different processing fluid is used. The processing fluid present from the preceding step may provide a source of chemical contamination or may result in the mixing of chemicals, which may produce undesirable results. Accordingly, under these circumstances, it may be very difficult to use the same processing chamber for other processing steps. As such, further processing reactors must be incorporated into the processing tool in order to execute the further processing steps. This results in an increased cost for the tool as well as an increase in the required tool footprint.

In view of the cross-contamination issues noted above, the development of paddles for providing localized processing of the surface of the workpiece has proceeded independent of the development of paddles for agitating a processing fluid proximate to the workpiece. The risk of cross contamination of the chemistries between each of the steps renders the co-development of these differing approaches counter-intuitive. As a result, the use of a paddle assembly within a given processing chamber has been effectively limited to a single processing step or purpose. The present inventors, however, have ignored such conventional wisdom and have developed a reactor for processing a microelectronic workpiece that employs a multi-purpose paddle assembly design that effectively reduces and/or eliminates many of the cross-contamination issues. In addition to the unique paddle assembly design, the reactor further incorporates unique features that enable it to be used to affect multiple processes at a single processing station. Still further, novel microelectronic workpiece processes and processing sequences naturally evolve from the unique reactor and/or paddle assembly design.

BRIEF SUMMARY OF THE INVENTION

In accordance with one independent aspect of the present invention an integrated tool for processing a workpiece is set forth including at least one processing station. The processing station comprises a bowl assembly, and a head assembly for receiving a workpiece and orienting the workpiece within the bowl assembly. The processing station further includes a paddle assembly, which includes a paddle adapted for movement relative to the workpiece when the workpiece is disposed on the head assembly within the bowl assembly. The processing station further comprises a fluid inlet for supplying processing fluid to the bowl assembly, and at least one fluid path for adjusting the position of the level of the processing fluid relative to the workpiece between a first position and a second position wherein when in a first position at least the portion of the workpiece to be processed is immersed within the processing fluid, and wherein when in the second position the portion of the workpiece to be processed is no longer immersed within the processing fluid. The position of the level of the processing fluid relative to the workpiece between a first position and a second position is controlled by a fluid level control mechanism. The fluid level control mechanism selectively controls the relative level of the processing fluid with respect to the workpiece by controlling the at least one fluid path.

In accordance with another independent aspect of the present invention a processing station is set forth for processing a workpiece. The processing station comprises a bowl assembly, and a head assembly for receiving a workpiece and orienting the workpiece within the bowl assembly. The processing station further includes a paddle assembly, which includes a paddle adapted for movement relative to the workpiece when the workpiece is disposed on the head assembly within the bowl assembly. The processing station further comprises a fluid inlet for supplying processing fluid to the bowl assembly, and at least one fluid path for adjusting the position of the level of the processing fluid relative to the workpiece between a first position and a second position wherein when in a first position at least the portion of the workpiece to be processed is immersed within the processing fluid, and wherein when in the second position the portion of the workpiece to be processed and possibly the paddle is no longer immersed within the processing fluid. The position of the level of the processing fluid relative to the workpiece to between a first position and a second position is controlled by a fluid level control mechanism. The fluid level control mechanism selectively controls the relative level of the processing fluid with respect to the workpiece by controlling the at least one fluid path.

In accordance with one embodiment of the processing station, the paddle supplies a fluid to the space between the paddle and the workpiece and recovers the fluid. The supplied fluid is confined to the space between the paddle and the workpiece prior to the fluid being recovered by the paddle.

In accordance with yet another independent aspect of the present invention a paddle for use proximate to a workpiece in a workpiece processing station is set forth. The paddle includes a surface, which faces the workpiece and comprises one or more sets of fluid delivery ports, and one or more sets of fluid recovery ports.

BRIEF DESCRIPTION OF THE SEVERAL VIEWS OF THE DRAWINGS

FIG. 13 is an exploded isometric view of one embodiment of a chassis sub-assembly suitable for use in the paddle assembly shown in FIG. 12.

FIG. 14 is an exploded isometric view of one embodiment of a spring float assembly upon which the chassis sub-assembly shown in FIG. 13 rests.

FIG. 15 is a side, cross-sectional view of the spring float assembly shown in FIG. 14.

FIG. 18 is a top plan view of one embodiment of a paddle for use in the paddle assembly shown in FIG. 12.

FIG. 19 is a cross-sectional side view of the embodiment of the paddle shown in FIG. 18.

FIG. 20 is an enlarged cross-sectional end view of the embodiment of the paddle shown in FIGS. 18 and 19.

FIG. 21 is an isometric view of one embodiment of a head assembly suitable for use in the processing station shown in FIGS. 4–6.

FIG. 22 is a side, cross-sectional view of the head assembly shown in FIG. 21.

FIG. 23 is an exploded isometric view of one embodiment of a workpiece engagement mechanism for use in the head assembly shown in FIGS. 21 and 22.

FIG. 24 is a cross-sectional side view of the workpiece engagement mechanism shown in FIG. 23.

DETAILED DESCRIPTION OF THE INVENTION

Figure 1:
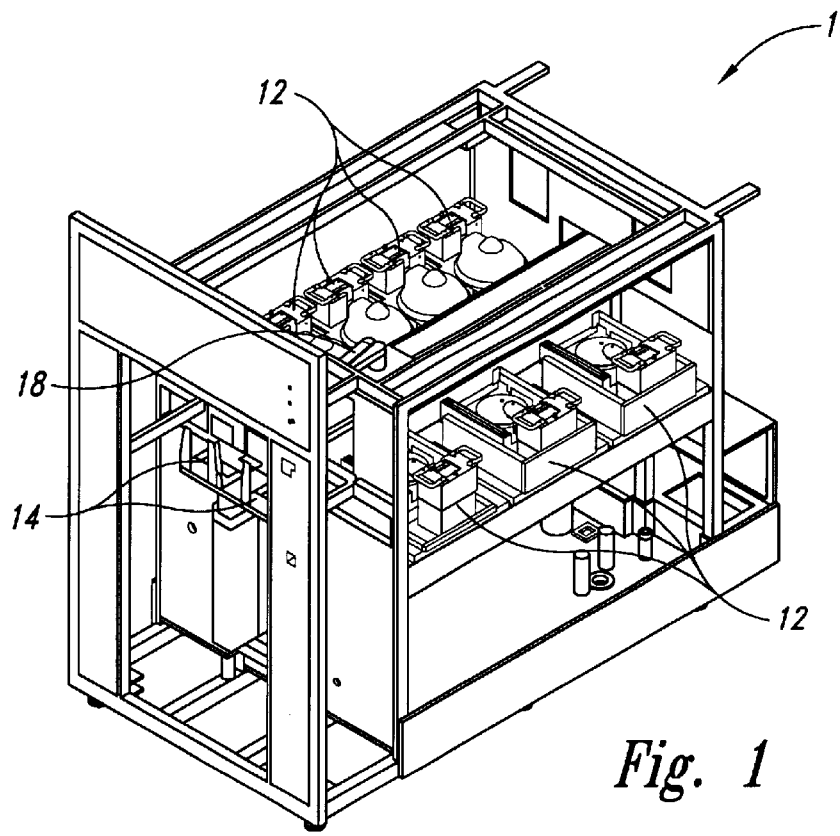
FIG. 1 is an isometric view of an integrated processing tool in accordance with one embodiment of the present invention in which the tool is shown with several panels removed.
Figure 2:
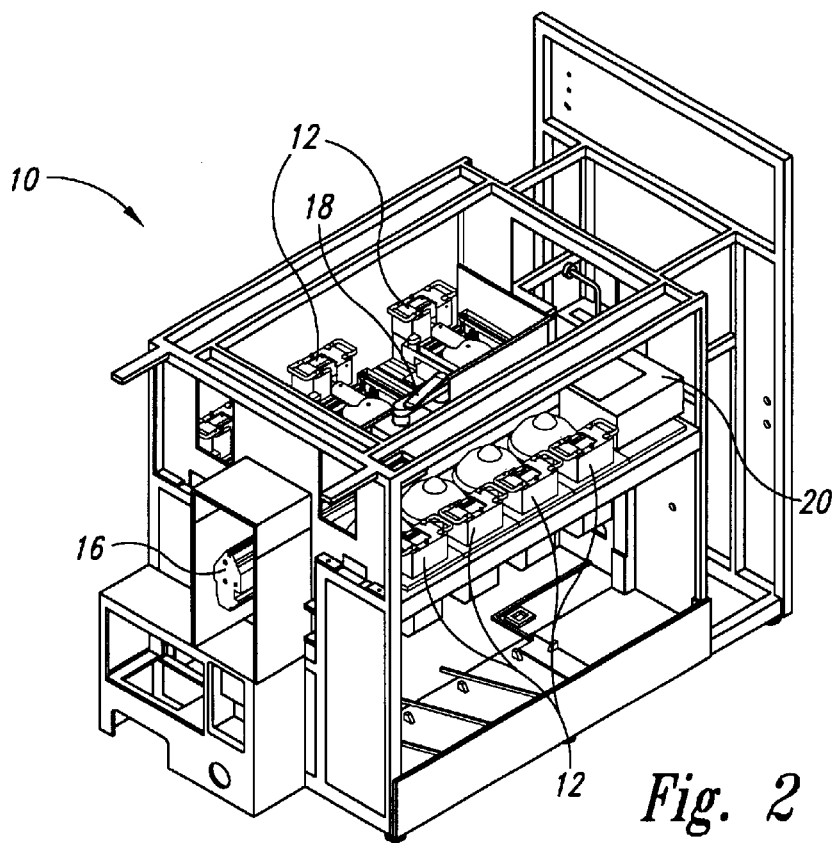
FIG. 2 is a further isometric view of the integrated processing tool shown in FIG. 1.

FIGS. 1 and 2 illustrate corresponding isometric views of an integrated processing tool 10, shown with several panels removed. The integrated processing tool 10 incorporates multiple processing stations 12. Workpieces are generally received within the integrated processing tool 10, via cassettes containing one or more workpieces. The cassettes containing the workpieces enter and exit the integrated processing tool 10, via a door in the side of the integrated processing tool 10, where the cassettes are received by a pair of lift/tilt mechanisms 14. The lift/tilt mechanisms 14 position and orient the cassettes to provide access to the individual workpieces contained therein. A linear conveyor system 16 receives the individual workpieces and relays them to the various processing stations 12.

Additional details in connection with the lift/tilt mechanism 14 and the linear conveyor system 16 are provided in connection with U.S. patent application Ser. No. 08/990,107, pending, entitled "Semiconductor Processing Apparatus having Linear Conveyor System", the disclosure of which is incorporated herein by reference.

In accordance with one embodiment, the linear conveyor system includes two wafer transport units 18 or robot arms, which move independently with respect to one another. One of the wafer transport units 18 handles dry workpieces, while the other wafer transport unit 18 handles wet workpieces.

The illustrated integrated processing tool 10 further includes a pre-aligner 20, which establishes the alignment of the workpiece with respect to the integrated processing tool 10 by referencing a known registration notch on each of the workpieces. Prior to forwarding the workpiece to any of the other processing stations, the wafer is placed within the pre-aligner 20 and the registration notch is located. After the pre-aligner 20 locates the registration notch, the pre-aligner 20 then makes any necessary adjustments of the orientation and alignment of the workpiece for facilitating proper subsequent handling. The integrated processing tool 10 can incorporate any one of several known pre-aligners commonly available. An example of one such suitable pre-aligner for use in the integrated processing tool 10, as presently configured, includes a prealigner manufactured and sold by PRI Automation, Equipe Division, under the model number PRE-201-CE.

Figure 3:
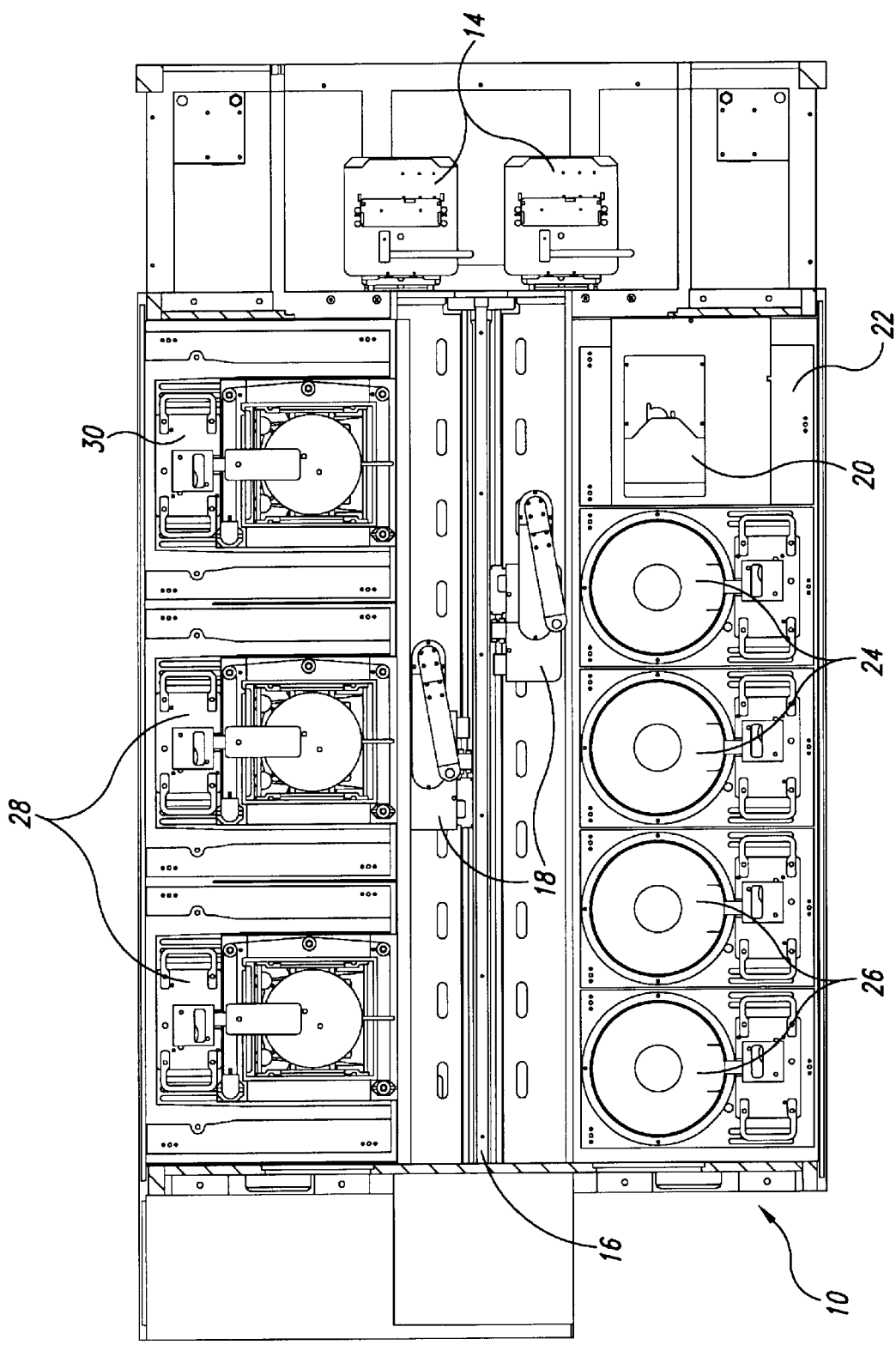
FIG. 3 is a top plan view of the tool deck of the embodiment of the integrated a processing tool shown in FIGS. 1 and 2.

The integrated processing tool 10 can further include various combinations and arrangements of individual processing stations. One such configuration which is consistent with the features of the present invention is illustrated in FIG. 3. In connection with FIG. 3, a description of an example of a corresponding process suitable for handling a workpiece pursuant to the illustrated configuration is similarly discussed. Specifically, FIG. 3 illustrates a top plan view of the tool deck 22 of the integrated processing tool 10, shown in FIGS. 1 and 2, including multiple individual processing stations 12.

As previously noted, the integrated processing tool 10 includes a pair of lift/tilt mechanisms 14, a linear conveyor system 16 including two independent wafer transport units 18, and a pre-aligner 20. The integrated processing tool 10 further includes a pair of SRD modules 24 (Spin, Rinse, Dry), a pair of pre-plate modules 26, a pair of magnetic processing stations 28, and one non-magnetic processing station 30.

The pre-plate modules 26 generally initially prepare the surface of the workpiece for further processing by spraying a mild acid or de-ionized water for wetting the surface of the workpiece and removing the oxides. The SRD modules 24 generally clean the workpiece by separately rinsing and drying the workpiece, after the workpiece has been processed. The non-magnetic processing station 30 is similar to the magnetic processing station 28, with the exception that the non-magnetic station 30 does not include a permanent magnet positioned around the processing station for encompassing the workpiece in a magnetic field during processing. Both types of processing stations 28 and 30 will be described in greater detail below in connection with the magnetic processing station 28.

It is important to note that the illustrated configuration represents one possible configuration, which is suitable for practicing the present invention, many other configurations would similarly be suitable.

As presently configured the integrated processing tool 10 is well suited to performing a process for producing read/write heads, which includes the following steps:

1. receiving a workpiece from a cassette and forwarding the workpiece to the pre-aligner 20;
2. receiving the pre-aligned workpiece from the pre-aligner 20 and forwarding the workpiece to a pre-plate processing module 26, wherein the workpiece is wet using a mild acid;
3. without drying the workpiece, forwarding the workpiece to one of the magnetic or non-magnetic processing stations 28 or 30, wherein within each of the processing stations the workpiece is subjected to a plating step wherein the processed surface of the workpiece is immersed within a plating fluid and wherein during the plating step the processing fluid is agitated by a paddle assembly;
4. without removing the workpiece from the magnetic or non-magnetic processing station 28 or 30, providing an in-situ rinse wherein the relative position of the workpiece with respect to the plating fluid is altered so as to no longer be immersed within the plating fluid, and using the paddle assembly for simultaneously applying a rinse solution and recovering the same;
5. repeating as often as necessary steps 3 and 4 by moving the workpiece directly between any one of the three magnetic or non-magnetic processing stations 28 or 30, for building up the desired multiple laminate layers;
6. after the last plating/in-situ rinse phase is performed, forwarding the workpiece to the SRD module 24 dedicated to rinsing;
7. after rinsing the workpiece, forwarding the workpiece to the SRD module 24 dedicated to drying; and
8. after drying the workpiece, returning the workpiece to the corresponding workpiece cassette at one of the lift/tilt mechanisms 14.

In connection with producing read/write heads the two magnetic processing stations 28, typically include chemistry for plating a nickel-iron alloy, wherein each of the stations 28 includes a solution of nickel and iron ions of differing concentrations. The non-magnetic processing station 30 typically includes chemistry for plating one of palladium-nickel, cobalt-nickel, or copper.

By plating the nickel-iron alloy in a magnetic processing station 28, a metallized layer, which is magnetically uniform, is produced. The details in connection with the magnetic processing station 28 are provided below. As previously noted producing a layer of material having a uniform magnetic layer precludes spinning the wafer within the magnetic field. Consequently, an approach for agitating the plating fluid using a paddle agitator has been developed and is described in greater detail below. The specific approach developed is additionally capable of providing for a rinse step within the same processing station 12, which does not adversely affect the processing fluid similarly located within the processing station 12, in this case a processing station 28 or 30. Furthermore the rinse phase within the same processing station 12 enables the workpiece to be forwarded directly to the next appropriate processing station 12 without first performing a separate rinse phase.

The below noted paddle design is not limited to being used in connection with a combination plating phase/rinsing phase, but could alternatively incorporate various other combinations of processing steps, including combinations, which include more than two unique steps.

Figure 4:
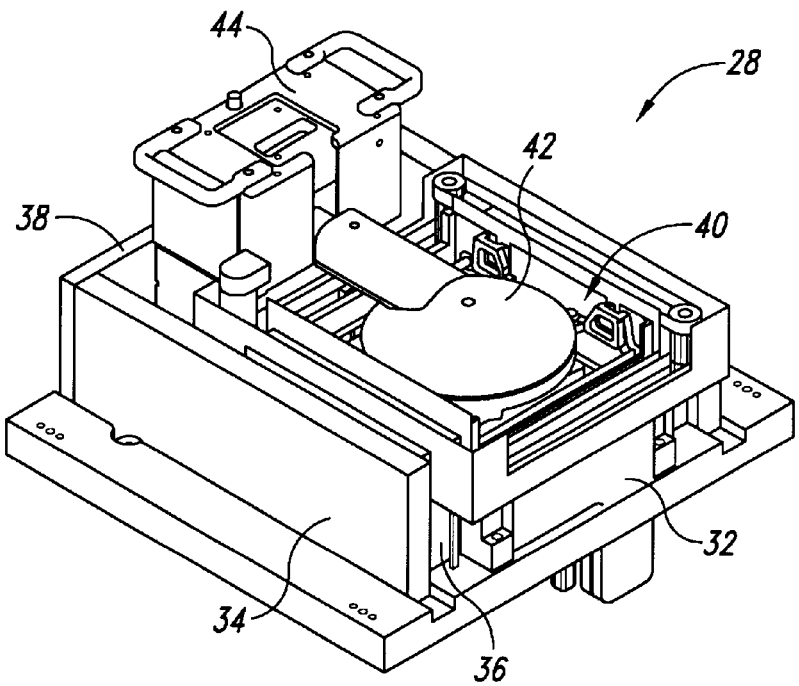
FIG. 4 is an isometric view of one embodiment of a processing station suitable for use in the embodiment of the tool shown in FIGS. 1–3, wherein the processing station incorporates one embodiment of a paddle assembly constructed in accordance with one aspect of the present invention.

FIG. 4 illustrates an isometric view of a magnetic processing station 28, shown in FIG. 3, in accordance with the present invention. As previously noted the non-magnetic processing station 30 is identical to the magnetic processing station 28 with the exception that the permanent magnet producing the magnetic field for magnetically aligning the plated material in the magnetic processing station 28 would not be present.

The magnetic processing station 28 includes a bowl assembly 32, within which a processing fluid is retained. Located around three sides of the bowl assembly is a "U"-shaped permanent magnet 34. The permanent magnet 34 includes two sections comprised of a suitably strong rare earth magnet 36. The two sections are located at opposite legs of the "U"-shaped magnet. In at least one embodiment, the rare earth magnet sections 36 are each comprised of a neodymium-iron-boron magnet (NdFeB). The two rare earth sections 36 are coupled together via a magnet section 38 comprising a 1018 ferrous material. The magnet section 38, comprising the 1018 ferrous material, provides a return path for the magnetic field produced between the rare earth magnetic sections 36.

Magnets made from other types of materials may also be suitable. Furthermore, while the disclosed embodiment uses a permanent magnet, an electromagnet could also alternatively be used.

Resting within the bowl assembly 32 is a paddle assembly 40, which is discussed below in greater detail beginning with FIG. 12. Additionally, extending into the bowl assembly 32 is a head assembly 42, similarly discussed below in greater detail beginning with FIG. 21. The head assembly 42 receives a workpiece and reorients and/or repositions the workpiece relative to the bowl assembly 32. The movement of the head assembly is facilitated by a lift and rotate assembly 44. An example of a lift and rotate assembly is described in greater detail in connection U.S. patent application Ser. No. 09/351,980, entitled "Lift and Rotate Assembly for Use in a Workpiece Processing Station and a Method of Attaching the Same", now U.S. Pat. No. 6,168,695, issued Jan. 2, 2001, the disclosure of which is incorporated herein by reference. In accordance with one embodiment the lift and rotate assembly 44 reorients the head assembly 42, so as to orient the side of the workpiece to be processed process side down in the processing fluid. Furthermore the level of the workpiece is raised and lowered by the lift and rotate assembly 44 with respect to the level of the processing fluid.

Figure 5:
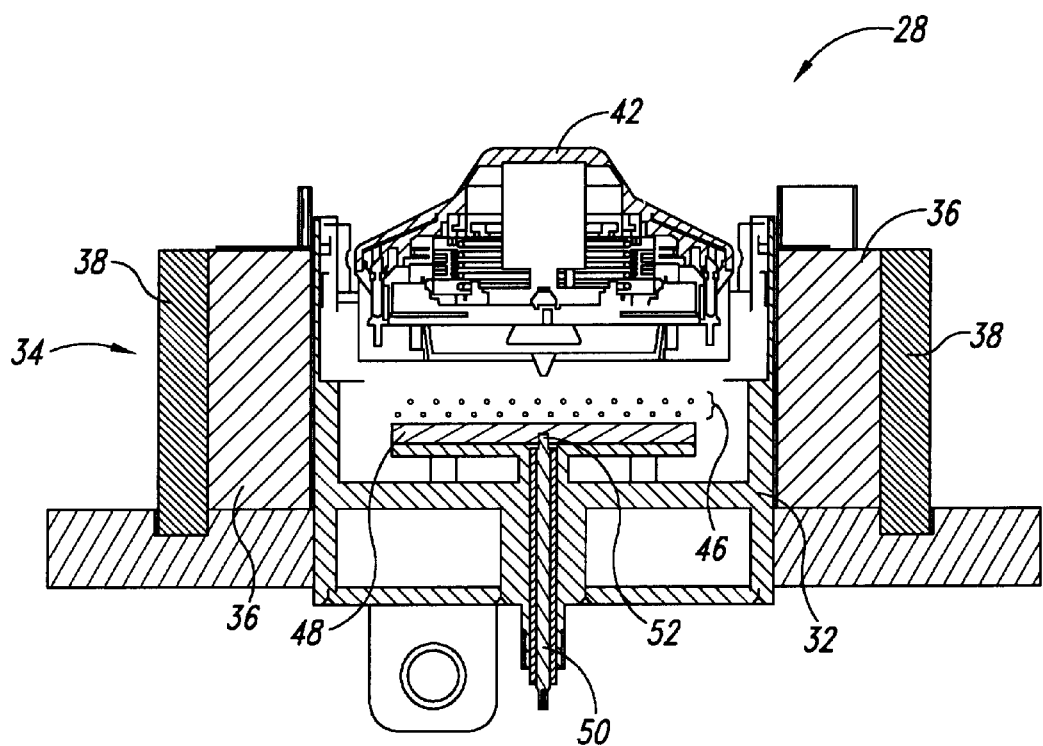
FIG. 5 is a front sectional view of the embodiment of the processing station shown in FIG. 4.

FIG. 5 illustrates a front sectional view of the processing station 28, shown in FIG. 4. In addition to the features noted above in connection with FIG. 4, the front sectional view further illustrates an array of diffuser holes 46 through which the processing fluid enters the bowl assembly 32. In accordance with the disclosed embodiment the processing fluid enters the bowl assembly 32 via a pump coupled to a fluid reservoir (not shown).

Additionally shown is an anode 48 located near the base of the bowl assembly. In connection with plating a nickel-iron alloy identified in the example process described above, and in accordance with at least one embodiment, the anode 48 is a consumable nickel anode. During processing, nickel ions are replenished into the processing fluid from the consumable anode. Iron ions are replenished by adding ferrous chloride to the recirculated processing fluid.

Furthermore in accordance with one embodiment of the present invention the lift and rotate assembly 44 includes a variable lift controller, wherein the lift and rotate assembly 44 can further adjust the degree of lift dependent upon the actual or determined location of the top surface of the consumable anode 48. As more of the anode 48 dissolves into the processing fluid, the lift and rotate assembly 44 adjusts the relative level of the workpiece to maintain a nearly constant distance between the anode 48 and the workpiece. Specifically, the lift and rotate assembly 44 could lower the workpiece an amount equivalent to the change in height of the consumable anode 48. In this way the field strength, which is related to the distance between the anode 48 and the workpiece, can be maintained at a relatively constant level.

In accordance with the disclosed embodiment, the anode 48 receives processing power via a conductive path 50 and an electrical connection 52 extending through the bottom of the bowl assembly 32 and coupling to the bottom of the anode 48.

Furthermore additional diffuser holes 46 are located behind the anode 48, through which the processing fluid enters the bowl assembly 32, and which can not be seen in the figures shown.

Figure 6:
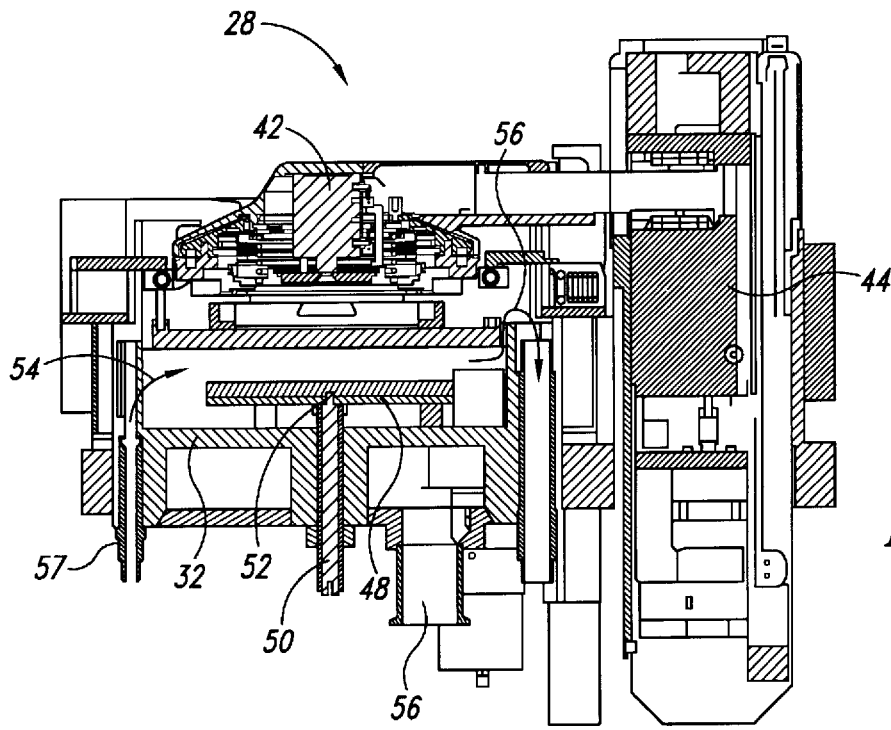
FIG. 6 is a side sectional view of the embodiment of the processing station shown in FIGS. 4 and 5.

FIG. 6 illustrates a side sectional view of the magnetic processing station 28, shown in FIGS. 4 and 5. In addition to the features previously discussed in connection with FIGS. 4 and 5, FIG. 6 further illustrates the flow path 54 of the processing fluid entering the bowl assembly 32 via the diffuser holes 46 (FIG. 5), and the flow path 56 of the processing fluid exiting the bowl assembly 32. The processing fluid enters the bowl assembly 32 via a fluid inlet 57. The processing fluid exits the bowl assembly via a drainage path 58. The fluid flow paths can be seen even more clearly in connection with FIGS. 7 and 8, which separately illustrates the bowl assembly 32.

Figure 7:
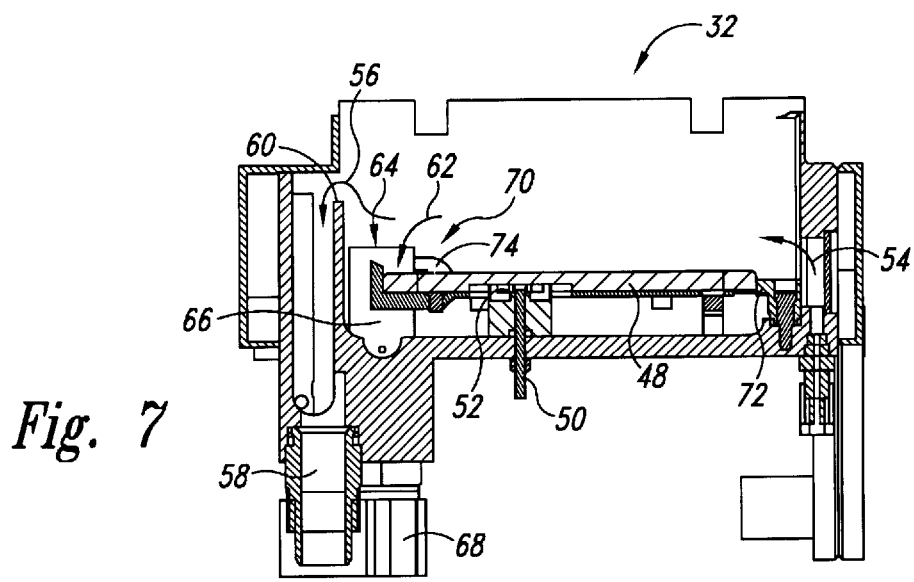
FIG. 7 is a side, cross-sectional view of one embodiment of a bowl assembly that is suitable for use in the processing station shown in FIGS. 4–6.
Figure 8:
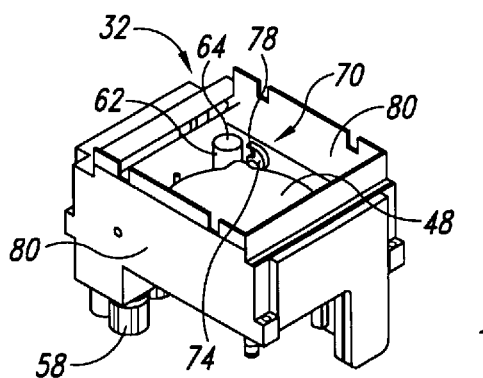
FIG. 8 is an isometric view of the embodiment of the bowl assembly shown in FIG. 7.

FIGS. 7 and 8 illustrates the bowl assembly 32, shown in FIGS. 4–6. As noted above, the fluid flow paths 54 and 56 are similarly shown. As further illustrated in FIG. 7 the flow path 56 exiting via the drainage path 58, exits the bowl assembly 32 over a weir 60. The weir 60 helps establish the height of the processing fluid as any fluid which is higher than the weir 60 will travel toward the weir 60 and exit the drainage path 58. As can be seen from FIG. 6 the level of the weir 60 is such that when the weir 60 provides the only drainage path 58 for the processing fluid, the fluid level will rise to a level higher than the bottom surface of the head assembly 42, when in a lowered position and any workpiece coupled thereto.

The bowl assembly 32 additionally provides for a further exit flow path 62 through an opening 64 in tube 66, which can be selectively opened, and which is lower then the flow path over the weir 60. The further exit flow path 62 is coupled to a further drainage path 68 and subsequently to a switch valve (not shown). Once opened the further exit flow path 62 will influence the level of the processing fluid in the bowl assembly 32 to a level consistent with the height of tube 66 and the opening 64. In this way the relative level of the processing fluid with respect to the bottom of the head assembly 42 and a workpiece coupled thereto can be adjusted so that the workpiece is no longer immersed in the processing fluid, without raising the head assembly 42.

When the workpiece is maintained at a level wherein the workpiece is immersed within the processing fluid, a processing step can occur, which includes the exposure of the workpiece to the processing fluid. When the fluid level of the processing fluid is adjusted relative to the workpiece so as to no longer immerse the workpiece within the processing fluid, a processing step can occur, which is independent of the processing fluid located within the bowl assembly 32.

Further shown in connection with FIG. 7, is a portion of a hinge assembly 70 coupled to the anode 48, and a latch 72 coupled to the anode 48 at the opposite end of the hinge assembly 70. In accordance with one embodiment, the hinge assembly 70 comprises a pair of approximately C-shaped connectors 74 coupled to an anode carrier 76 (more clearly shown in connection with FIGS. 9–11). The pair of approximately C-shaped connectors 74 separately engage a pair of rods 78 extending from opposite sides 80 of the bowl assembly 32.

The hinge assembly 70 helps to restrict the angle of movement of the anode 48 during installation and removal. This can be beneficial in view of the strong magnetic forces a nickel anode or an anode formed from another magnetically conductive material will be subject to from the magnet 34 located around the bowl assembly 32. During installation and the removal of the anode 48, a handle mechanism is temporarily attached to the anode 48 for facilitating greater control of the anode 48 while moving the anode 48 within the magnetic field.

Figure 9:
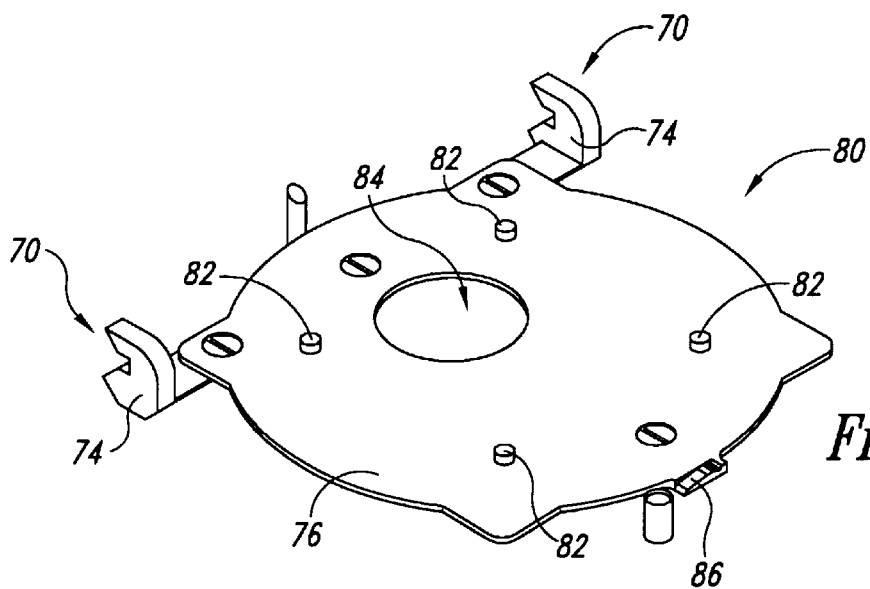
FIG. 9 is a top isometric view of one embodiment of an anode assembly suitable for use in the bowl assembly shown in FIGS. 7 and 8.
Figure 10:
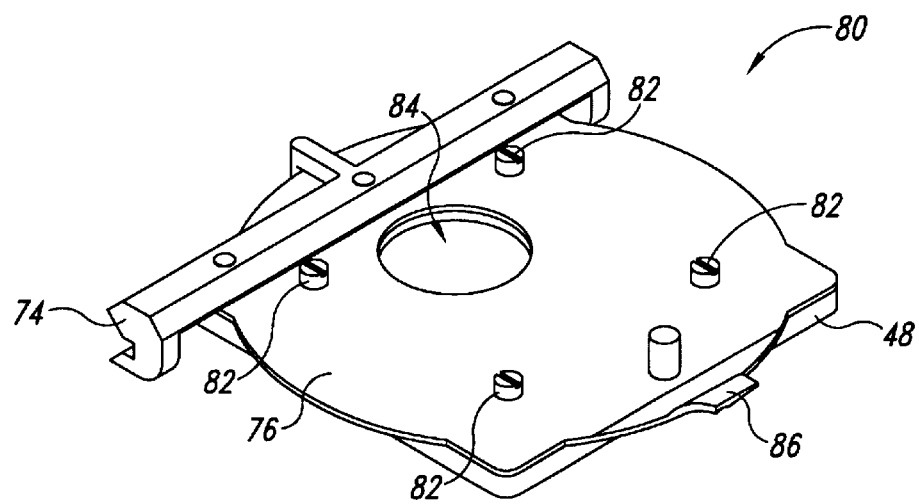
FIG. 10 is a bottom isometric view of the anode assembly shown in FIG. 9.
Figure 11:
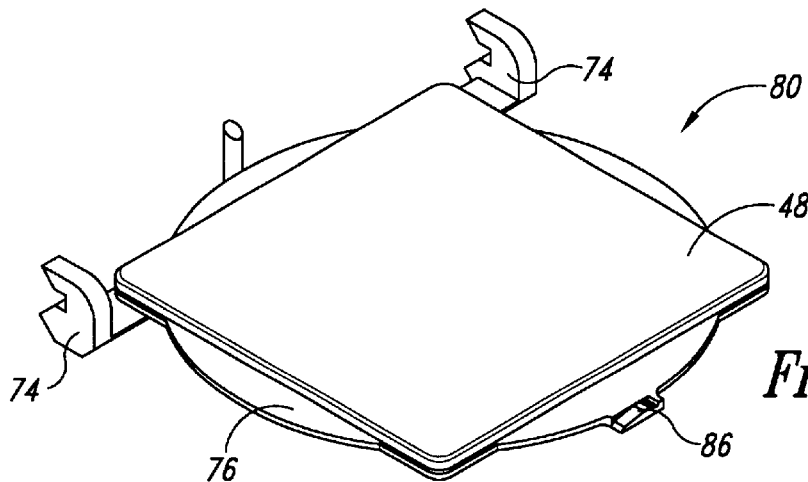
FIG. 11 is a top isometric view of the anode assembly shown in FIGS. 9 and 10, wherein the anode assembly includes a square anode.

FIGS. 9–11 illustrate an anode assembly 80 for use in connection with the bowl assembly 32, shown in FIGS. 7 and 8. The anode assembly 80 includes an anode carrier 76, which is sized and shaped to receive either a square anode or a circular anode. In accordance with one embodiment, the magnetic processing station 28 and non-magnetic processing station 30 are configured to receive either an approximately 4.5 inch square workpiece or an approximately 6 inch round workpiece. The square anode would be used in connection with a square workpiece, and a circular anode would be used in connection with a circular workpiece.

The anode 48 is coupled to the anode carrier 76 via one or more fasteners 82 connected through the bottom of the anode carrier 76. The anode carrier 76 further includes an opening 84 through which an electrical connection 52 can be made to the bottom of the anode 48 for supplying processing power thereto. The anode carrier 76 still further includes a latch platform 86 upon which a latch can be hooked.

Figure 12:
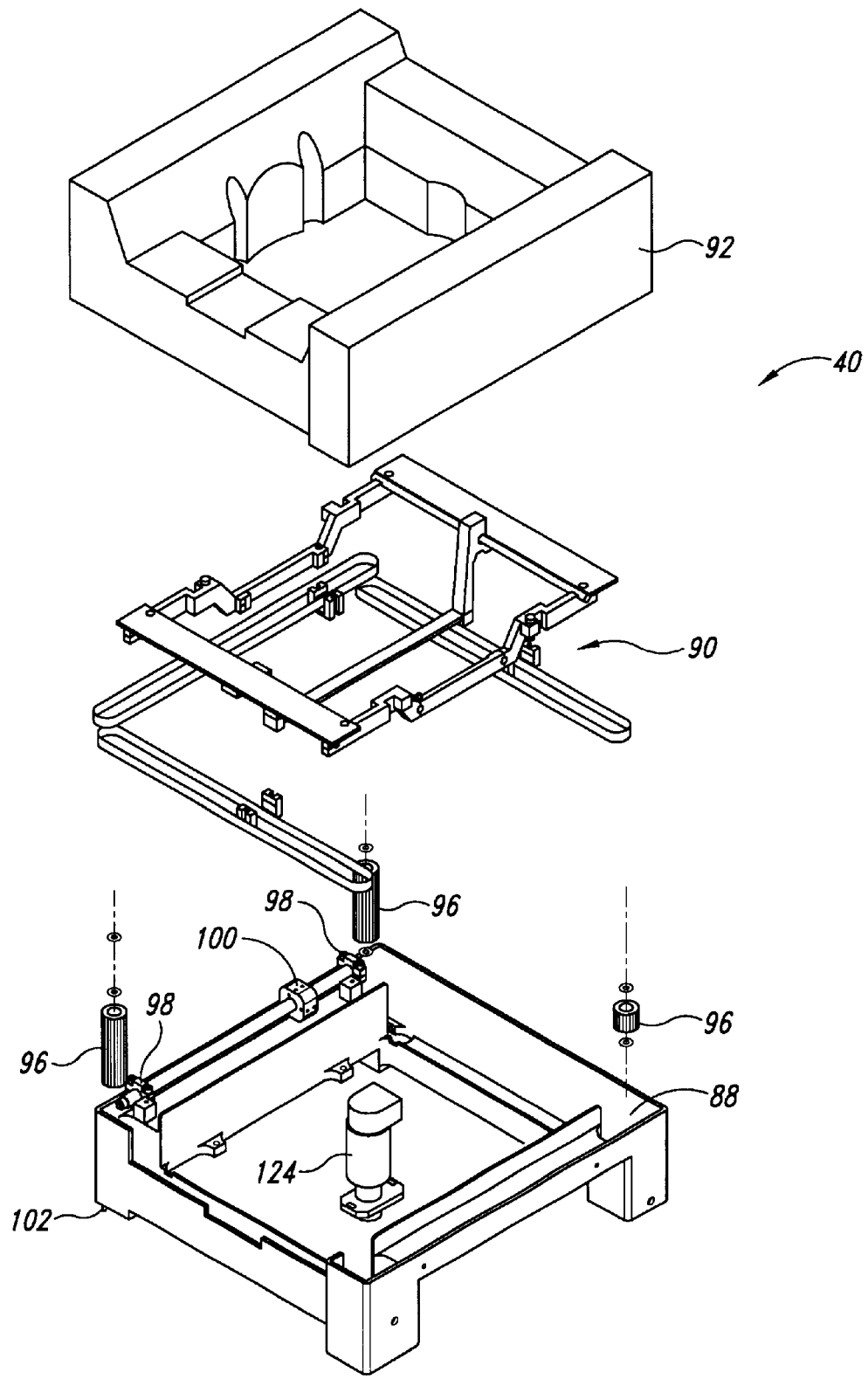
FIG. 12 is an exploded isometric view of the embodiment of the paddle assembly used the processing station shown in FIGS. 4–6.

FIG. 12 illustrates an exploded isometric view of a paddle assembly 40 for use in connection with the magnetic or non-magnetic processing station 28 or 30, shown in FIGS. 4–6. The paddle assembly includes a chassis sub-assembly 88, a paddle actuation sub-assembly 90 which rests within the chassis sub-assembly 88, and a shroud 92 for enclosing the paddle actuation sub-assembly 90. A more detailed discussion concerning each of the noted sub-assemblies are provided below in connection with FIGS. 13–20.

FIG. 13 illustrates an exploded isometric view of the chassis sub-assembly 88 for the paddle assembly 40, shown in FIG. 12. As illustrated in FIG. 13, the exploded view of the chassis sub-assembly 88 illustrates pulley rods 94 and various mounting hardware 95 for attaching the pulley rods 94 to the chassis sub-assembly 88. The pulley rods 94 provide a point of connection for attaching corresponding pulleys 96 (FIGS. 12 and 16), which will be discussed in greater detail in connection with FIG. 16. Additionally coupled to the chassis sub-assembly 88 is mounting hardware 98 for attaching a position sensor 100, shown in FIG. 12.

The chassis sub-assembly 88 further provides four mounting pins 102, located at each corner of the chassis sub-assembly 88. Each of the mounting pins 102 rest upon a corresponding spring float assembly 104, shown in FIGS. 14 and 15, which is positioned between the chassis sub-assembly 88 of the paddle assembly 40 and the bowl assembly 32. The spring float assemblies 104 provide a degree of float or self-adjustment for positioning the paddle assembly 40 with respect to the bowl assembly 32.

The spring float assembly 104 is shown in FIGS. 14 and 15. FIG. 14 illustrates the spring float assembly 104 in an exploded isometric view. FIG. 15 illustrates a cross sectional view of the spring float assembly 104.

The spring float assembly 104 provides for a housing 106 having a central passageway 107, within which a spring float shaft 108 is received. At one end of the spring float shaft 108, the shaft includes a portion 110, which is wider thereby restricting motion of the shaft 108 past a specific point 112, illustrated in FIG. 15, within the shaft having a narrower diameter. The shaft 108 is biased toward this point 112 by a spring 114 similarly located within the central passageway 107 of the housing 106. The end of the spring 114 opposite the point of contact with the shaft 108 is fixed with respect to the housing 106 by a retainer 116.

The retainer 116 is held in place by a snap ring 118. The snap ring 118 is a discontinuous circular ring, which may be squeezed so as to deform the ring so as have a smaller deformed diameter. When deformed, the snap ring 118 can slide into the bottom opening 120 of the housing 106 past the more restrictive shaft diameter, and expand and fit within a groove 122 located in the wall of the central passageway 107 having a larger diameter, which is proximate to the opening 120.

While the spring float assembly 104 can be a separate assembly, as illustrated in connection with FIGS. 14 and 15, the spring float assembly 104 can also be integrated as part of the paddle assembly 40 or the bowl assembly 32.

Figure 16:
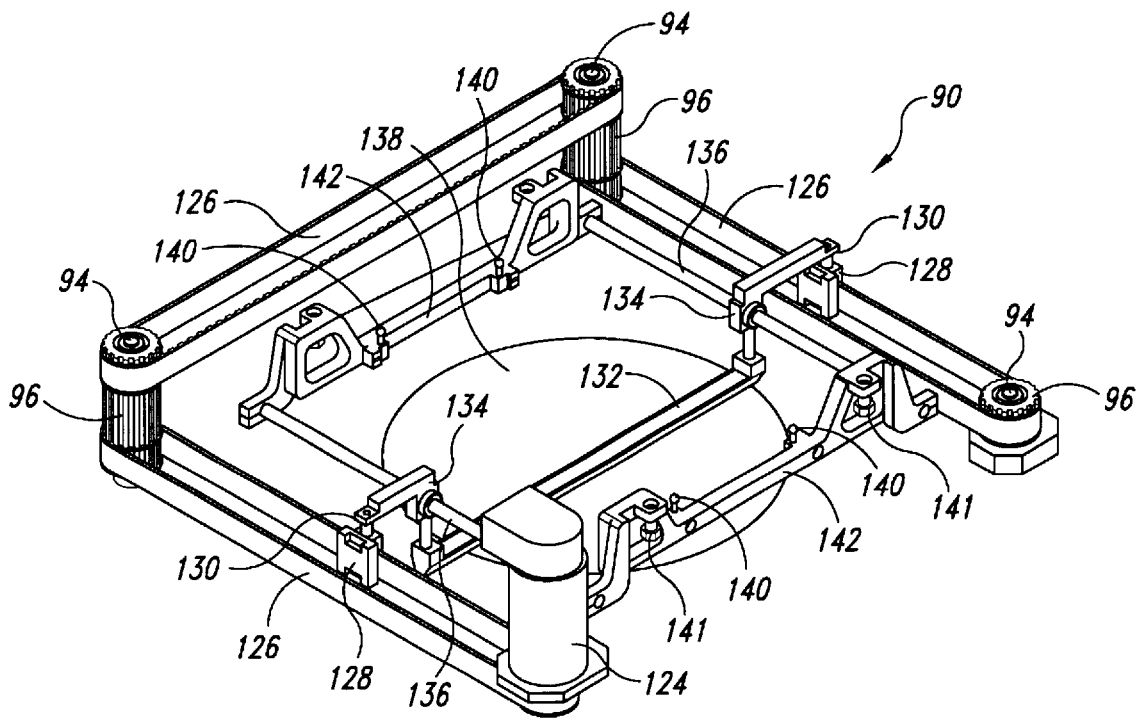
FIG. 16 is an isometric view of one embodiment of a paddle actuation sub-assembly that may be used in the paddle assembly shown in FIG. 12, with a silhouette of a circular workpiece shown for reference purposes.
Figure 17:
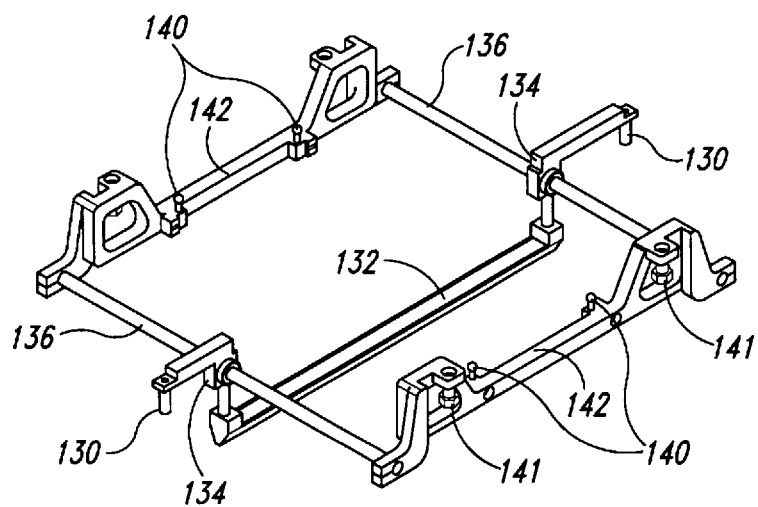
FIG. 17 is a partial isometric view of the paddle actuation sub-assembly shown in FIG. 16.

A paddle actuation sub-assembly 90 and/or portions thereof are illustrated in connection with FIGS. 16 and 17. As shown in connection with FIG. 16, the paddle actuation sub-assembly 90 includes pulleys 96, which ride upon corresponding pulley rods 94, also shown in connection with FIG. 13. The pulleys 96 and corresponding pulley rods 94 are located at three of the four corners of the paddle actuation sub-assembly 90. At the fourth corner of the paddle actuation sub-assembly 90 is a motor 124.

The adjacent pulleys 96, and one of the pulleys adjacent to the motor 124 and the motor 124 are attached to one another via corresponding drive belts 126. In accordance with one embodiment, the gear ratios of the pulleys are one to one, such that the rates of movement of the drive belts 126 are substantially equivalent. The pulleys 96 and the drive belts 126 enable the force supplied by the motor 124 at one side of the paddle actuation sub-assembly 90 to be similarly supplied to the opposite side of the paddle actuation sub-assembly 90.

Attached to the drive belts 126 on each of the opposite sides is an engagement mechanism 128. The engagement mechanisms 128 each attach to a corresponding area of engagement 130 associated with a paddle 132 for transferring the relative movement of the drive belts 126 to the paddle 132. While only a single engagement mechanism 128, associated with a single area of engagement 130 is necessary for moving the paddle 132, in the disclosed embodiment a pair of engagement mechanisms 128 are used. Driving the paddle 132 from both ends of the paddle 132 enables a more uniform or even movement to be achieved. The drive belt 126 associated with the adjoining side is coupled to a moveable portion of the position sensor 100 (FIG. 12).

The areas of engagement 130 are coupled to the paddle 132 via corresponding connecting assemblies 134. As a result, as the drive belts 126 move, so does the paddle 132. The speed at which the paddle 132 moves is related to the drive speed of the motor 124. Consequently, the speed of the paddle 132, with respect to the workpiece, can be controlled by controlling the speed of the motor 124.

The connecting assemblies 134 include an opening through which a pair of corresponding travel guides 136 are received, and upon which the connecting assemblies 134 travel. The travel guides 136 guide the movement of the paddle 132 laterally through a relatively uniform motion. The travel guides 136 additionally help maintain a consistent relative spacing between the surface of a paddle and a nearby workpiece. A silhouette 138 of a workpiece is shown for reference purposes.

The travel guide 136 additionally helps to maintain relative spacing between the paddle 132 and the workpiece 138 via positioning points 140, located on a travel guide cross member 142. The positioning points 140 mate with corresponding sockets 144 located on the head assembly 42. The sockets 144 will be discussed in greater detail below in connection with FIGS. 21 and 28.

The positioning points 140 of the travel guide 136 are set with respect to the sockets 144 of the head assembly 42, so as to provide a relative distance between the paddle 132 and a corresponding workpiece 138. In accordance with one embodiment, the relative distance is between approximately 40 thousandths of an inch and 80 thousandths of an inch.

An additional set of ball assemblies 141, coupled to the travel guide cross member 142 and oriented in the opposite direction of positioning points 140, are provided for coupling the paddle actuation sub-assembly 90 to corresponding sockets 143 (FIG. 13), which are integrated as part of the chassis sub-assembly 88.

FIGS. 18–20 illustrate various plan views of a paddle 132 for use in connection with the paddle assembly 40, shown in FIG. 12. FIG. 20 is shown enlarged with respect to the other two views to enable easier viewing of the corresponding details associated therewith. In accordance with one embodiment, the paddle 132 is an elongated member having an approximately rectangular surface 146, which faces the workpiece 138, as illustrated in FIG. 19. In accordance with the same or similar embodiment, the paddle 132 has a generally triangular cross-section 148, as illustrated in FIG. 20. The triangular cross-section helps to facilitate the desired degree of fluid agitation, when used in connection with the processing of the workpiece 138, when the workpiece 138 is immersed in the processing fluid. However some degree of fluid agitation will be achieved regardless of the cross-sectional shape of the paddle. Accordingly the use of other cross-sectional shapes for the paddle 132 are possible.

The approximately rectangular surface 146 of the paddle 132 includes one or more sets of fluid delivery ports 150 and one or more sets of fluid recovery ports 152. In accordance with one embodiment, the paddle 132 includes a single set of fluid delivery ports 150, which are generally aligned in a row down the center of the surface 146 of the paddle 132. The fluid delivery ports 150 are coupled to a common supply channel 154, which runs the approximate length of the paddle 132. The common supply channel 154 facilitates fluid delivery to the surface of the paddle through the corresponding set of fluid delivery ports 150.

In at least one embodiment, the common supply channel 154 is located below the fluid delivery ports 150. The fluid delivery ports 150 are coupled to the common supply channel 154 by drilling down from the surface 146 of the paddle 132 to the common supply channel 154. The common supply channel 154 is open at one end 156 for receiving the fluid to be delivered, via a fluid source couple thereto.

The size of each of the fluid delivery ports 150 can be varied so as to insure the desired amount of fluid is delivered at each point along the length of the paddle 132. In accordance with at least one embodiment, the size of the fluid delivery ports 150 generally increase as the distance between the fluid delivery port 150 and the open end 156 of the common supply channel 154 increases. One exception being proximate the closed end of the common supply channel 154, where instead of the size of the fluid delivery ports 150 further increasing, the size of the fluid delivery ports begin to decrease.

The fluid source is coupled to the common supply channel 154 via a regulator, which controls the rate of fluid flow, and a switch valve, which enables or disables the fluid flow. In addition to providing the mechanism for supplying a fluid to the surface 146 of the paddle 132, the set of fluid delivery ports 150 could additionally provide a source for additional fluid agitation.

The surface 146 of the paddle 132 includes two sets of fluid recovery ports 152, one set located on each side of the single set of fluid delivery ports 150. The fluid recovery ports 152 are coupled to a corresponding common return channel 158, which similarly runs the approximate length of the paddle 132. Each set of fluid recovery ports 152 facilitates providing a negative pressure with respect to the surface 146 of the paddle 132. Because a set of fluid recovery ports 152 is provided on each side of the set of fluid delivery ports 150, the fluid can readily be recovered regardless of the present direction of travel of the paddle 132.

In addition to being offset widthwise with respect to the fluid delivery ports 150, each set of fluid recovery ports 152 are offset lengthwise with respect to one another. By offsetting lengthwise each set of the fluid recovery ports 152, with respect to one another, both sets can be coupled to the same corresponding common return channel 158, while minimizing their effects with respect to one another.

In at least one embodiment, the common return channel 158 is located below the common supply channel 154. The fluid recovery ports 152 are coupled to the common return channel 154 by drilling down from the surface 146 of the paddle 132 at an angle to the common return channel 158.

The common return channel 158 similarly has an open end 160 at one end of the paddle 132. The negative pressure is created by a vacuum, which is supplied to the set of fluid recovery ports 152 via a pump coupled to the open end 160 of the common return channel 158. The pump is coupled to the common return channel 158 via a separator in series with a valve. The separator separates the fluids and gases received via the fluid recovery ports 152. The rate of negative pressure at the surface 146 of the paddle 132 is controlled by controlling the speed of the pump.

As noted previously above, the speed of the paddle 132, with respect to the workpiece, can be controlled by controlling the speed of the motor 124. This enables the rate of movement of the paddle 132 to be altered. By altering the rate of movement of the paddle 132 the rate of agitation of the processing fluid, or the rate and/or time of exposure of a corresponding portion of the workpiece to processing conditions, when the paddle 132 is used to deliver and/or recover fluids with respect to the workpiece may similarly be altered.

Furthermore the velocity of the paddle can be altered as a function of time. The specific velocity can additionally be varied based on one or more of a variety of processing parameters. One such example includes altering the velocity of the paddle based on amp-minutes of processing power supplied. Such an alteration could account or compensate for predicted changes in chemical concentrations within the processing fluid. Other such processing parameters could additionally be used as a basis of altering the velocity of the paddle 132.

In accordance with one embodiment, the paddle 132 is formed from a non-magnetic high strength engineering plastic. In addition to plastic, the paddle 132 could alternatively be formed from titanium. Titanium readily forms a layer of titanium oxide, which resists plating and provides good electrical isolation.

In at least one embodiment, one or more conductor segments could be provided at the surface 146 of the paddle 132 for supplying processing power thereto, so as to act as a cathode or an anode dependent upon the polarity of the power supplied with respect to the corresponding electrode.

Additionally the paddle 132 could incorporate additional sets of fluid delivery ports 150 and fluid recovery ports 152, and additional corresponding common supply channels 154 and common return channels 158. In this way sets of fluid delivery ports 150 and fluid recovery ports 152 having varying supply and recovery rates can be provided. Alternatively the additional fluid delivery ports 150 and fluid recovery ports 152 could be used to supply and recover different types of chemicals, either simultaneously or alternatively Alternative sizes and shapes for the paddle 132 could also be used.

FIGS. 21 and 22 illustrate the head assembly 42 for receiving a workpiece. As noted previously the head assembly reorients and/or repositions the workpiece relative to the bowl assembly 32. The movement of the head assembly 42 is facilitated by a lift and rotate assembly 44. The head assembly 42 is coupled to the lift and rotate assembly 44 via an arm 161. In addition to coupling the head assembly 42 to the lift, and rotate assembly 44, the arm 161 generally defines an axis of rotation 163 (FIG. 22) about which the head assembly 42 rotates.

The head assembly 42 includes a slot 162 through which a workpiece can be received. After the head assembly 42 receives the workpiece, the workpiece is then lowered onto the workpiece standoffs 164. Angled surfaces associated with the sidewalls 166 serve to properly position the workpiece as it is lowered onto the workpiece standoffs 164. One portion of the sidewalls 166 is primarily suited for properly positioning a square workpiece as it is placed on the workpiece standoffs 164. The other portion of the sidewalls 166 is primarily suited for properly positioning a circular workpiece as it is placed on the workpiece standoffs 164.

The head assembly shown in FIG. 21 further illustrates sockets 144 for receiving positioning points 140 of the travel guide 136. The sockets 144 in combination with the positioning points 140 when properly adjusted insures a consistent spatial relationship between a workpiece and the paddle 132. A method of adjustment is illustrated in connection with FIG. 28, and discussed below in greater detail.

The head assembly 42 further provides for a workpiece engagement mechanism 168, which applies backside pressure against a received workpiece for pressing the workpiece up and against a current thief assembly 170 (FIGS. 25 and 26), attached thereto. The current thief assembly 170 is coupled to the head assembly 42 via a quick release mechanism 172. The operation of the quick release mechanism is discussed in greater detail in connection with U.S. patent application Ser. No. 09/429,446, pending, entitled "Method, Chemistry, and Apparatus for Noble Metal Electroplating on a Microelectronic Workpiece", the disclosure of which is incorporated herein by reference.

FIGS. 22–24 illustrate in greater detail the workpiece engagement mechanism 168. Specifically, FIG. 23 provides an exploded isometric view of the workpiece engagement mechanism 168, while FIGS. 22 and 24 provide cross sectional side plan views of the workpiece engagement mechanism 168, both separately (FIG. 24) and incorporated as part of the head assembly 42 (FIG. 22).

The workpiece engagement mechanism 168 includes a conductive ring base 174, which has a center opening 176 through which a non-conductive base member 178 is received. The non-conductive base member 178 has an outer diameter, which generally corresponds to the inner diameter of the conductive ring base 174. The conductive ring base 174 includes a generally circular depression along the interior surface, within which the conductive ring base 174 is adapted for receiving a first end of a biasing spring 180. Coupled to the other end of the biasing spring 180 is an upper ring conductor 182. The upper ring conductor 182 is coupled to a connector 184 for receiving processing power. The biasing spring being conductive provides a path through which the processing power is relayed to the conductive ring base 174.

Similarly coupled between the conductive ring base 174 and the upper ring conductor 182, and encompassing the biasing spring 180 is a bellows 185, which has sides which expand and contract with the relative motion of the conductive ring base 174 and the upper ring conductor 182. The bellows 185 provides a physical barrier, which prevents external fluids from entering portions of the workpiece engagement mechanism 168.

Coupled to the non-conductive base member 178 is a dual acting pneumatic cylinder 186. Coupled to the dual acting pneumatic cylinder 186 are two ports 188 through which fluid lines can be connected for actuating the pneumatic cylinder 186. Actuating the pneumatic cylinder 186 creates a force for exerting lateral pressure against the non-conductive base member 178. The force is aligned along the same axis in both the same and opposite direction as the corresponding force created by the biasing spring 180. The pneumatic cylinder 186 in combination with the biasing spring 180 produce a force which extends and retracts the workpiece engagement mechanism 168 so as to engage and release the workpiece received by the head assembly 42. The spring provides the additional beneficial feature that if for some reason the pneumatic cylinder 186 were to lose pressure, the spring would provide sufficient force to retain the workpiece engagement mechanism 168 in a closed fail safe position.

The pneumatic cylinder 186 similarly provides the mechanism for supplying a backside nitrogen gas purge to the workpiece.

Additionally coupled to the pneumatic cylinder 186 is a circuit board assembly 190 including a pair of sensors 192 for monitoring the lateral travel of the pneumatic cylinder 186 relative to the conductive ring base 174. In a accordance with one embodiment, the sensors 192 are optical sensors, which detect the passage of an external flag. The external flag interrupts a beam of light traveling between corresponding elements of the sensor. The flag 194 is coupled to the conductive ring base 174, whereas the sensors are coupled to the pneumatic cylinder 186.

A first of two sensors 192 defines an open position for the workpiece engagement mechanism 168. A second of two sensors 192 defines a closed position for, the workpiece engagement mechanism 168.

Coupled to the exterior surface of the conductive ring base 174 is a belville ring contact 196. When the workpiece engagement mechanism 168 is in the closed position, contact is made with the backside surface of a workpiece received by the head assembly 42, via the belville ring contact 196. The belville ring contact 196 includes a continuous conductive ring around which conductive elements 198 are coupled thereto at discrete positions. The conductive elements extend inward toward the center of the ring. It is the discrete inwardly extending elements 198, which generally make contact with the backside of the workpiece, and supply processing power thereto. In at least one embodiment seventy-two conductive elements 198 are provided at seventy-two discrete positions around the perimeter of the belville ring contact 196.

The workpiece engagement mechanism 168 additionally includes a further seal 200, which is coupled to the conductive ring base 174 and partially encloses the belville ring contact 196.

Figure 25:
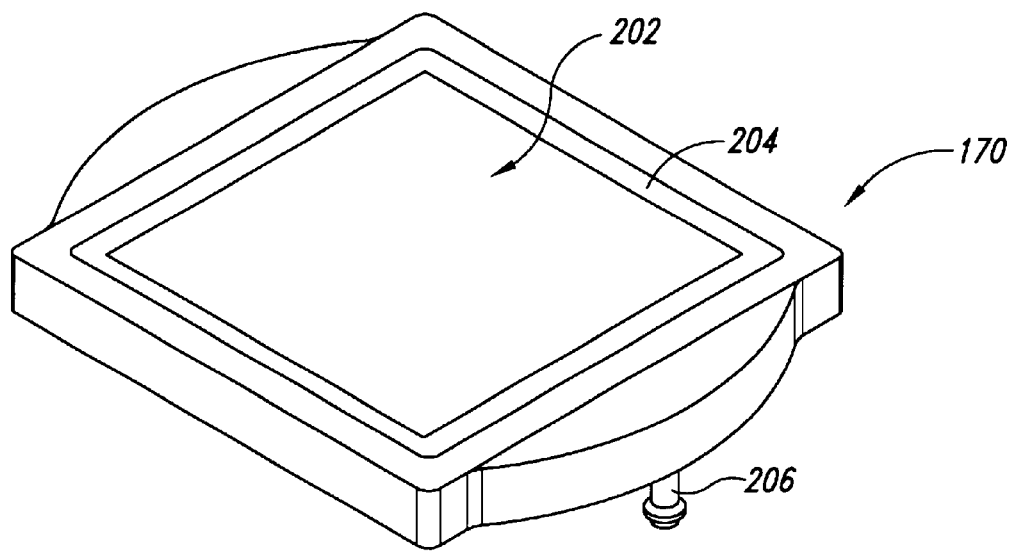
FIG. 25 is an isometric top view of one embodiment of a current thief assembly suitable for use in connection with the head assembly shown in FIGS. 21 and 22.

FIG. 25 illustrates an isometric top view of a current thief assembly 170 for use in connection with the head assembly 42, shown in FIGS. 21 and 22. The operation of a current thief is previously well known in the art. Generally a current thief redirects the plating of material away from the outer edges of the workpiece. In absence of using a current thief, a greater amount of material is generally deposited at the outer edge of the workpiece. This is because of certain edge effects. The current thief generally moves the edge effect away from the outer edge of the workpiece to the outer edge of the current thief The current thief assembly 170 as shown in FIG. 25, is adapted for receiving a square workpiece.

Accordingly, the current thief assembly 170 has a square center opening 202 for receiving the square workpiece. Generally the exposed surface is coated with a dielectric material, with the exception of the portion of the exposed surface immediately adjacent and extending around the workpiece opening. The exposed portion of the conductive surface not coated with a dielectric material functions as a current thief 204.

By altering the size and shape of the opening, and the size and shape of the area immediately adjacent and extending around the opening which is not coated with a dielectric material, a current thief assembly 170 can be adapted for use with workpieces having a variety of sizes and shapes.

It is noted that in accordance with one embodiment, the current thief assembly 170 has an outer size and shape, which is sufficiently large to provide a complementary surface opposite the surface of the paddle 132, which extends the full length of the paddle as the paddle moves through its full range of travel.

The current thief assembly 170 additionally includes a pair of posts 206 located on opposite sides of the current thief assembly 170. The posts 206 are used for coupling the current thief assembly 170 to the head assembly 42 via the quick release mechanisms 172.

In addition to providing a physical connection, the posts 206 additionally provide for an electrical connection. In the disclosed embodiment, located within the quick release mechanism 172 is a banana plug connector 208 (FIG. 26), which is received within the post 206. As the post engages the quick release mechanism 172, the banana plug 208 is compressed causing the center portion of the banana plug 208 to expand outward and engage the internal surface of the post 206, thereby making an electrical connection. In this way processing power can be supplied to the current thief 204.

Figure 26:
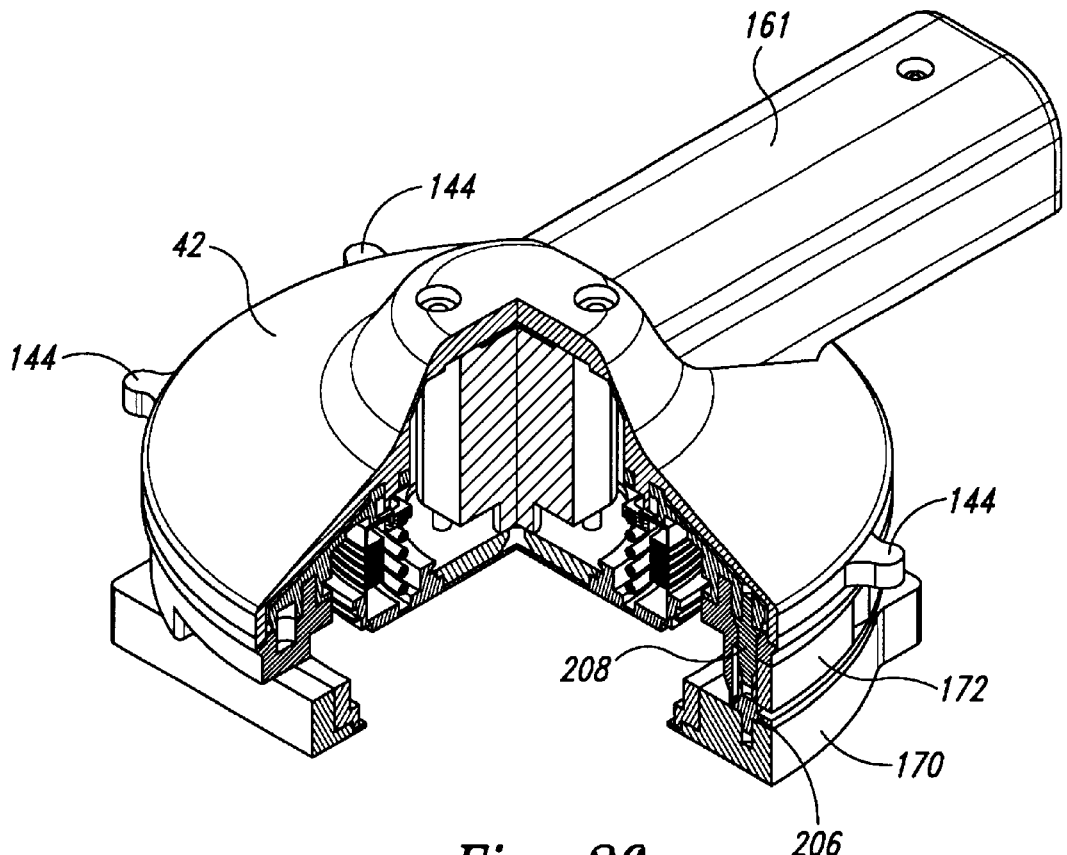
FIG. 26 is an isometric/cut-away view of the embodiment of the head assembly, shown in FIGS. 21 and 22, with the embodiment of the current thief assembly, shown in FIG. 25, attached thereto.

FIG. 26 illustrates an isometric view of the head assembly 42, shown in FIGS. 21 and 22, with the current thief assembly 170, shown in FIG. 25, attached thereto. FIG. 26 further illustrates a portion of both the head assembly 42 and the current thief assembly 170, cut away, so as to illustrate the banana plug 208 making a connection with the post 206.

Figure 27:
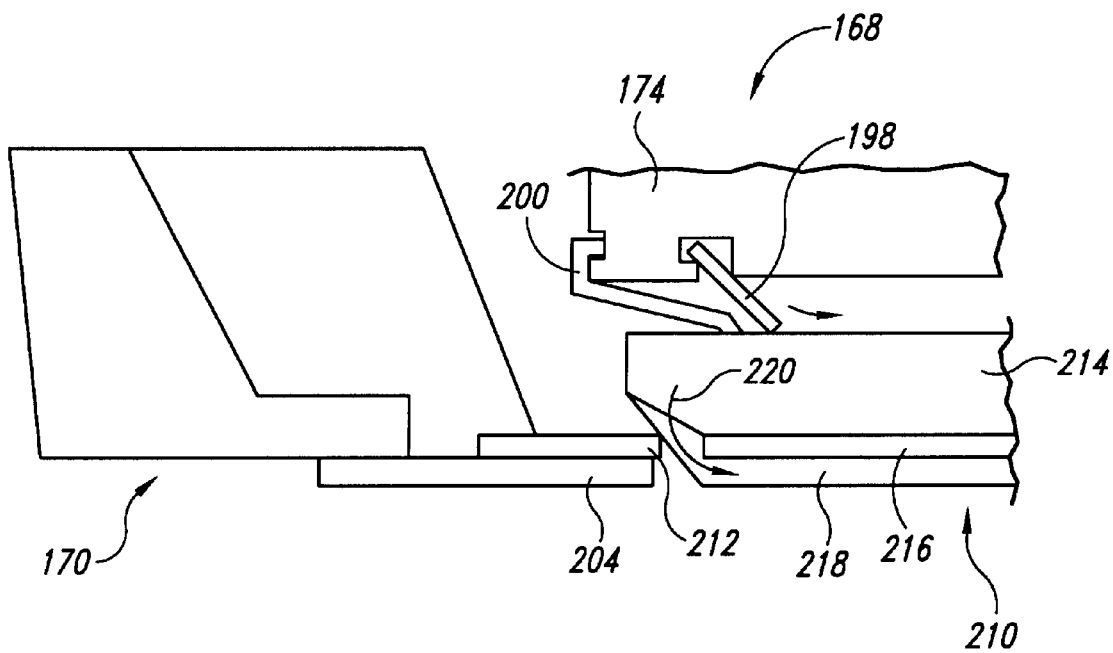
FIG. 27 is a cross-sectional side view of a workpiece in contact with the embodiment of the current thief assembly shown in FIG. 26, and the embodiment of the workpiece engagement mechanism, shown in FIGS. 23 and 24.

FIG. 27 illustrates a cross sectional side view of the workpiece engagement mechanism 168, shown in FIGS. 23 and 24 applying backside pressure against a received workpiece 210 for pressing the workpiece against the current thief assembly 170, shown in FIG. 26.

Specifically, as the conductive ring base 174 of the workpiece engagement mechanism 168 moves against the workpiece 210, the discrete inwardly extending elements 198 are pressed down and scrape into the backside of the workpiece 210. At approximately the same time, the seal 200 similarly engages the backside surface of the workpiece 210. The workpiece 210 is similarly brought into contact with a non-conductive seal 212 located at the backside surface of the current thieving portion 204 of the current thief assembly 170.

In connection with the above noted process, backside contact is possible wherein the workpiece 210 has a substrate 214, which is conductive. Processing power is supplied to the portion of the workpiece 210 to be processed through the conductive substrate 214, and around the generally non-conductive barrier layer 216, via a seed layer 218, which extends around the barrier layer 216 and contacts the substrate 214. The path of the processing power is illustrated by arrow 220.

While a backside contact has been disclosed in connection with the disclosed embodiment, one skilled in the art should readily appreciate that other embodiments incorporating front side contact would similarly be possible.

Figure 28:
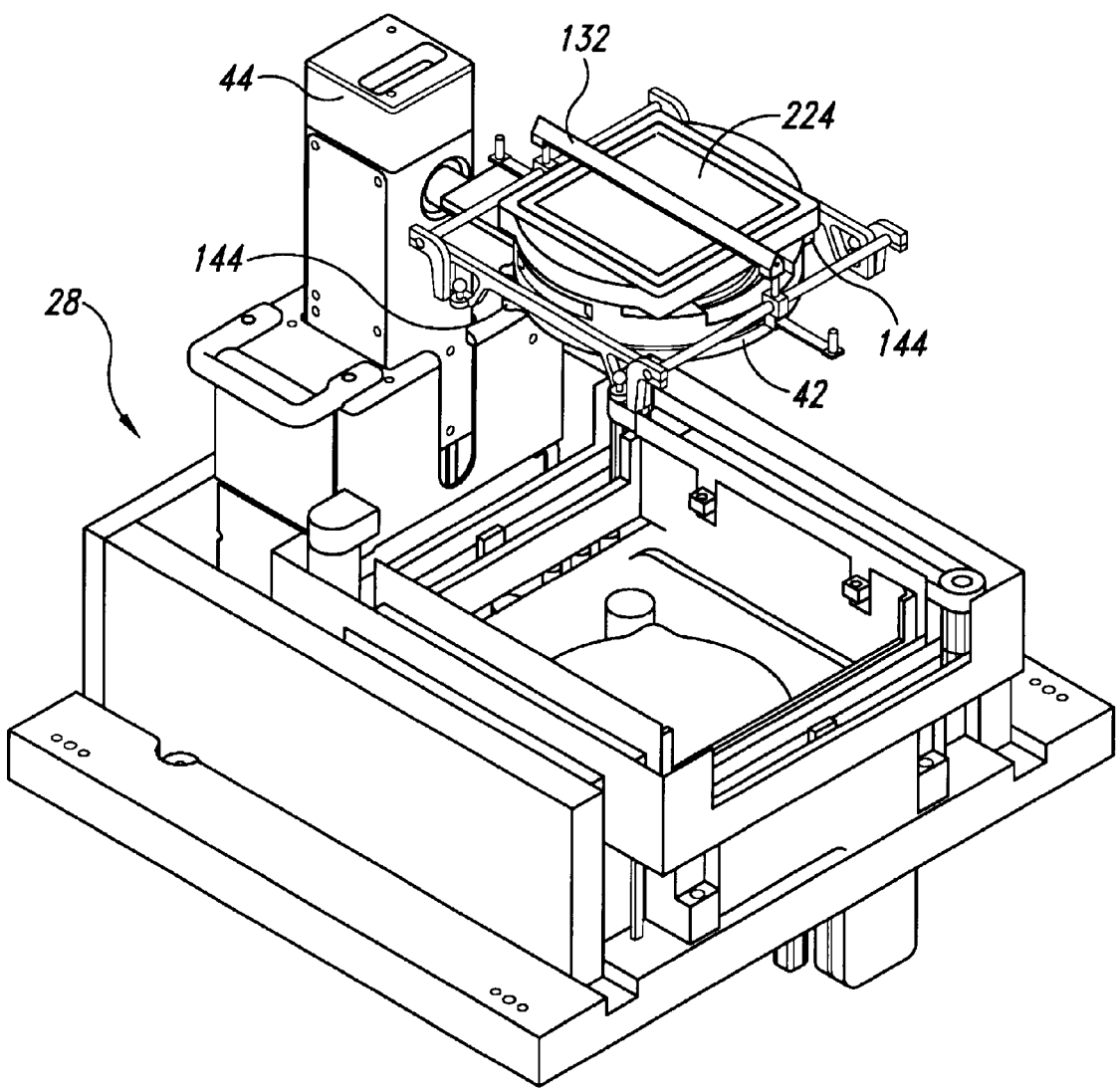
FIG. 28 is an isometric view of the embodiment of the processing station shown in, FIGS. 4–6, wherein the portion of the paddle actuation sub-assembly corresponding to FIG. 17 has been removed and placed upon the head assembly, shown in FIGS. 21 and 22, and where the head assembly has been oriented in a first position for receiving a workpiece.

As discussed previously in connection with one embodiment, the relative distance between the paddle 132 and the workpiece is between approximately 40 thousandths of an inch and 80 thousandths of an inch. FIG. 28 illustrates one suitable method for adjusting the paddle distance. Specifically, FIG. 28 illustrates an isometric view of the processing station 28 shown in, FIGS. 4–6, wherein the portion of the paddle actuation sub-assembly 90 corresponding to FIG. 17 has been removed and placed upon the head assembly 42, shown in FIGS. 21 and 22, when the head assembly 42 is oriented in a position for receiving a workpiece. More specifically positioning points 140 of the paddle actuation sub-assembly 90 are aligned with corresponding sockets 144 of the head assembly 42.

One of the benefits to placing the portion of the paddle actuation sub-assembly on top of the head assembly 42 is that it provides easier access to the gap distance, away from the rest of the paddle assembly 40, which limits access thereto. This is possible because the gap distance is controlled by positioning points 140 of the paddle actuation sub-assembly 90, the sockets 144 of the head assembly 42, and the corresponding structure therebetween, which has been similarly positioned onto the head assembly 42.

A blank 224 having a thickness consistent with the thickness of the workpiece can be received within the head assembly 42, and the head assembly can be placed into a closed position. This will insure that the relative spacing of the workpiece is accounted for. The relevant portion of paddle actuation sub-assembly 90 is then placed upon the head assembly 42, wherein the positioning points 140 are aligned with the corresponding sockets 144. A gauge for measuring spacing can then be placed between the paddle 132 and the blank 224, and checked while the paddle 132 is positioned at various travel points relative to the head assembly 42. If necessary the height of the paddle 132 can be adjusted. In this way the desired spacing can be provided between the paddle 132 and the workpiece.

As noted previously the paddle 132, described above, is capable of being used in connection with at least two types of processing. The first type of processing uses the paddle 132 to facilitate fluid agitation of the processing fluid proximate the surface of the workpiece 138, when the portion of the workpiece 138 to be processed is immersed within a processing fluid. In this instance the fluid agitation is achieved by moving the paddle relative to the portion of the workpiece 138 to be processed. In this way relatively fresh processing fluid whose chemical concentrations have not yet been been significantly affected by the localized effects of the reaction taking place at the surface of the workpiece will mix in and continuously replace the stale fluid.

As also noted previously the delivery or recovery of processing fluid by one or more sets of fluid recovery ports 152 and one or more sets of fluid delivery ports 150 could similarly be used to enhance fluid agitation or supply fresh chemistry proximate the workpiece 138.

The second type of processing uses the paddle to supply and recover fluids proximate the surface of the workpiece 138, when the portion of the workpiece 138 to be processed is not immersed within a processing fluid. In this instance fluid is supplied to the portion of the workpiece 138 to be processed via one or more sets of fluid delivery ports 150. In conjunction with supplying the fluid to the portion of the workpiece 138 to be processed, the fluid may similarly be recovered via one or more sets of fluid recovery ports 152.

By additionally recovering the fluid via one or more sets of fluid recovery ports 152, the fluid supplied can be confined to the approximate space located between the paddle 132 and the workpiece 138, without coming into contact with chemically distinct processing fluid, which may be similarly located in the processing station 28 or 30 or come into contact with surfaces which may later be exposed to other chemistry.

Figure 29:
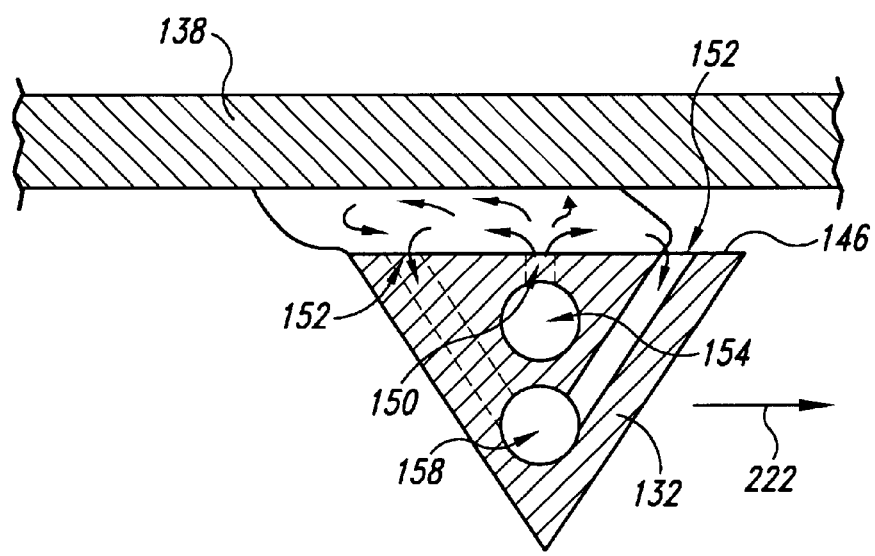
FIG. 29 is a partial, cross-sectional side view of the embodiment of the paddle, shown in FIGS. 18–20, and a corresponding workpiece, in which the paddle is supplying a fluid to the workpiece.

FIG. 29 illustrates a partial cross sectional side view of the paddle 132, shown in FIGS. 18–20, and a workpiece 138, wherein the paddle 132 is both supplying a fluid to the workpiece 138 and recovering a fluid supplied to the workpiece 138.

The paddle 132 is shown moving in a direction from left to right, as illustrated by arrow 222. FIG. 29 helps to further illustrate the confined nature of the processing fluid supplied to space between the paddle 132 and the workpiece 138, via the set of fluid delivery ports 150, wherein one or more sets of fluid recovery ports 152 are similarly recovering the processing fluid.

Generally the fluid is retained within the space as a result of the volume of processing fluid not being allowed to exceed the volume of fluid, which can be supported by the corresponding surface tension. At the same time sufficient fluid needs to be present to fill the gap. Accordingly, the rate of recovery of processing fluid via the fluid recovery ports 152 needs to be set taking into account the rate of supply of processing fluid via the fluid delivery ports 150.

As a result of the movement of the paddle 132, the fluid tends to trail behind the paddle 132. However so long as the overall fluid volume is maintained between acceptable levels, the fluid can still be confined within the appropriate space. An example of possible fluid flow within the volume of fluid formed within the space is illustrated by small arrows.

In the process noted above in connection with the formation of read/write heads, the paddle 132 is used to provide a rinse function while the workpiece 138 is present within the processing station 28 or 30, which similarly provides for the electroplating of material onto the workpiece 138. After the plating step is concluded, the level of the processing fluid relative to the workpiece 138 is adjusted so that the workpiece 138 is no longer immersed within the processing fluid. The paddle then supplies to and recovers from the workpiece 138, a fluid different from the processing fluid within which the workpiece 138 was previously immersed. In this case the fluid is a rinse solution. More particularly the rinse solution is de-ionized water. After the workpiece is rinsed, the workpiece 138 may be directly forwarded to the next processing station 28 or 30.

By delivering fluids to the workpiece 138 via the space located between the paddle 132 and the workpiece 138, the present system has the benefit that a minimal volume of chemistry is used. Furthermore the area of delivery can be much more precisely controlled. Consequently, spraying can be reduced as well as backside exposure of the workpiece 138. Still further, the sequential movement of the workpiece 138 through multiple processing stations 12 can be greatly simplified.

In the above noted example, the paddle 132 delivers de-ionized water to the workpiece. The paddle could further supply de-ionized water, where ozone has been dissolved therein. In these or other instances a source of ozone may be separately supplied within the processing chamber. Furthermore, the fluid supplied by the paddle 132 could additionally include a temperature differential, wherein a cooled or a heated fluid is supplied to the workpiece.

As previously noted, the specific construction of the paddle 132 could be adjusted to accommodate further fluid supplies and fluid recoveries to allow even greater flexibility, including multiple sequential processes simultaneously.

Other processes which would be also suitable for use with the expanded capabilities of the paddle 132, provided for by the present invention, include: electroplating, electroless plating; etching metal; developing photo resist; cleaning a workpiece surface including using an acid, a solvent, and/or de-ionized water; metal lift off, thinning silicon; chemically etching; and/or chemically machining.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A processing station for processing a microelectronic workpiece comprising:
    a bowl assembly;
    a head assembly for receiving a workpiece and orienting the workpiece within the bowl assembly;
    a paddle assembly including a paddle and a plurality of spaced-apart fluid delivery ports, the paddle being adapted for movement relative to the workpiece when the workpiece is disposed on the head assembly within the bowl assembly and the fluid delivery ports being oriented toward the workpiece when the workpiece is disposed on the head assembly within the bowl assembly;
    a fluid inlet for supplying processing fluid to the bowl assembly;
    at least one fluid path for adjusting the position of the level of the processing fluid relative to the workpiece between a first position, wherein at least the portion of the workpiece to be processed is immersed within the processing fluid, and a second position, wherein the portion of the workpiece to be processed is not immersed within the processing fluid; and
    a fluid control level mechanism for selectively controlling the at least one fluid path thereby enabling the position of the level of the processing fluid relative to the workpiece to adjust between the first position and the second position.

2. A processing station as set forth in claim 1 wherein said at least one fluid path includes:
    a first fluid outlet coupled to a drainage path, the first fluid outlet having a first flow path opening at a height above the workpiece processing position for limiting the level of the processing fluid to the approximate height of the first flow path opening; and
    a second fluid outlet selectively coupled to the drainage path, the second fluid outlet having a second flow path opening at a height below the workpiece processing position for selectively lowering the level of the processing fluid to the approximate height of the second flow path opening.

3. A processing station as set forth in claim 1 wherein said paddle assembly further includes a motor for moving the paddle relative to the workpiece, wherein when the level of the processing fluid is at the first position the relative movement of the paddle agitates the processing fluid proximate the workpiece.

4. A processing station as set forth in claim 1 further comprising an electrode located within the bowl assembly.

5. A processing station as set forth in claim 4 wherein said electrode is an anode.

6. A processing station as set forth in claim 5 wherein said anode is a consumable anode.

7. A processing station as set forth in claim 6 wherein said head assembly is coupled to the bowl assembly via a lift and rotate assembly.

8. A processing station as set forth in claim 7 wherein said lift and rotate assembly includes a variable lift adjust mechanism for adjusting the processing position of the workpiece relative to the anode as the anode is consumed.

9. A processing station as set forth in claim 4 wherein said electrode includes a pivot mechanism for hingeably coupling the electrode to the bowl assembly.

10. A processing station as set forth in claim 9 wherein said electrode includes a latch mechanism located opposite the pivot mechanism for securing the end of the electrode relative to the bowl assembly.

11. A processing station as set forth in claim 1 wherein said head assembly includes a contact assembly for securing the workpiece relative to the head assembly.

12. A processing station as set forth in claim 11 wherein said contact assembly is adapted for supplying processing power to the surface of the workpiece.

13. A processing station as set forth in claim 11 wherein said head assembly further includes a back side contact for engaging the workpiece and supplying processing power when the workpiece is secured relative to the head assembly.

14. A processing station as set forth in claim 1 further comprising a magnet for creating a magnetic field relative to the processing position of the workpiece.

15. A processing station as set forth in claim 14 wherein said magnet is a permanent magnet.

16. A processing station as set forth in claim 15 wherein said magnet is coupled to the bowl assembly and is located so as to extend substantially around the bowl assembly.

17. A processing station as set forth in claim 16 wherein said magnet substantially extends around at least three sides of the bowl assembly.

18. A processing station as set forth in claim 1 further comprising a processing space substantially located between the paddle and the workpiece when the level of the processing fluid is at the second position.

19. A processing station as set forth in claim 18 wherein the paddle assembly further includes a motor for moving the paddle and the processing space relative to the workpiece.

20. A processing station as set forth in claim 19 wherein the paddle assembly further includes a variable speed motor control for adjusting the speed of the motor and the speed with which the paddle moves relative to the workpiece.

21. A processing station as set forth in claim 18 wherein the paddle includes one or more sets of fluid delivery ports for supplying one or more fluids to the processing space substantially located between the paddle and the workpiece.

22. A processing station as set forth in claim 21 wherein the paddle further includes one or more sets of fluid recovery ports for recovering fluids supplied to the processing space.

23. A processing station as set forth in claim 22 further comprising a variable rate flow controller coupled to the fluid recovery ports for varying the rate of recovery of the fluid supplied to the processing space.

24. A processing station as set forth in claim 23 wherein the variable rate flow controller is adapted to set the rate of recovery at a level which confines the fluid supplied to the processing space to the region within the processing space prior to the fluid being recovered via the fluid recovery ports.

25. A processing station as set forth in claim 21 wherein the paddle further includes an electrode for supplying processing power to the paddle.

26. A processing station as set forth in claim 1 wherein said head assembly includes a current thief which extends substantially around the workpiece.

27. A processing station as set forth in claim 26 wherein said current thief is sized so that in combination with the workpiece the current thief and the workpiece substantially extend at least the full length of the paddle over the range of processing motion of the paddle.

28. A processing station as set forth in claim 1 wherein said paddle assembly further includes a motor for moving the paddle relative to the workpiece, wherein when the level of the processing fluid is at the second position the relative movement of the paddle permits the processing fluid to be delivered across a surface of the workpiece through the fluid delivery port.

29. A processing station as set forth in claim 1 wherein said paddle assembly further includes at least one fluid recovery port positioned proximate the workpiece when the workpiece is disposed on the head assembly within the bowl assembly.

30. An integrated tool for processing a workpiece including at least one processing station, said processing station comprising:
a bowl assembly;
a head assembly for receiving a workpiece and orienting the workpiece within the bowl assembly;
a paddle assembly including a paddle and a plurality of spaced-apart fluid delivery ports, the paddle being adapted for movement relative to the workpiece when the workpiece is disposed on the head assembly within the bowl assembly and the fluid delivery ports being oriented toward the workpiece when the workpiece is disposed on the head assembly within the bowl assembly;
a fluid inlet for supplying processing fluid to the bowl assembly;
at least one fluid path for adjusting the position of the level of the processing fluid relative to the workpiece between a first position, wherein at least the portion of the workpiece to be processed is immersed within the processing fluid, and a second position, wherein the portion of the workpiece to be processed is not immersed within the processing fluid; and
a fluid control level mechanism for selectively controlling the at least one fluid path thereby enabling the position of the level of the processing fluid relative to the workpiece to adjust between the first position and the second position.

31. A processing station for processing a microelectronic workpiece comprising:
a bowl assembly;
a head assembly adapted to position a workpiece within the bowl assembly;
a paddle assembly including a paddle and a plurality of spaced-apart fluid delivery ports, the paddle being adapted for movement relative to the workpiece when the workpiece is positioned within the bowl assembly and the fluid delivery ports being adapted to deliver a fluid to a surface of the workpiece;
a fluid inlet in fluid communication with the bowl assembly;
at least one fluid path; and
a fluid level control operatively coupled to the at least one fluid path and adapted to adjust a level of the processing fluid between a first level, wherein a surface of the workpiece is immersed within the processing fluid, and a second level, wherein the surface is not immersed within the processing fluid.

32. A processing station for processing a microelectronic workpiece comprising:
a bowl assembly;
a head assembly adapted to position a workpiece within the bowl assembly;
a paddle means for delivering a first processing fluid flow through a plurality of spaced-apart fluid delivery ports to a surface of the workpiece when the workpiece is positioned within the bowl assembly;
a fluid inlet for supplying a second processing fluid flow to the bowl assembly; and
a fluid level control means adapted to adjust a level of processing fluid between a first level, wherein the surface of the workpiece is immersed within the processing fluid, and a second level, wherein the surface is not immersed within the processing fluid.

33. A processing station as set forth in claim 32 wherein the paddle means is adapted to deliver the first processing fluid flow to the surface of the workpiece when the processing fluid is at the first level.

34. A processing station as set forth in claim 32 wherein the paddle means is adapted to deliver the first processing fluid flow to the surface of the workpiece when the processing fluid is at the second level.

* * * * *

UNITED STATES PATENT AND TRADEMARK OFFICE
CERTIFICATE OF CORRECTION

PATENT NO. : 6,547,937 B1
DATED : April 15, 2003
INVENTOR(S) : Oberlitner et al.

It is certified that error appears in the above-identified patent and that said Letters Patent is hereby corrected as shown below:

Column 4,
Line 33, delete "a" between "integrated" and "progressing";

Column 11,
Line 30, "comer" should be -- corner --;

Column 15,
Line 53, delete comma between "for" and "the";

Signed and Sealed this

Thirtieth Day of September, 2003

JAMES E. ROGAN
*Director of the United States Patent and Trademark Office*